US012621364B2

(12) United States Patent
Tutuianu et al.

(10) Patent No.: US 12,621,364 B2
(45) Date of Patent: May 5, 2026

(54) REMOTE MAPPING OF CIRCUIT SPEED VARIATION DUE TO PROCESS, VOLTAGE AND TEMPERATURE USING A NETWORK OF DIGITAL SENSORS

(71) Applicant: Taiwan Semiconductor Manufacturing Company Limited, Hsinchu (TW)

(72) Inventors: Bogdan Tutuianu, The Hills, TX (US); Osamu Takahashi, Round Rock, TX (US)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 334 days.

(21) Appl. No.: 18/124,040

(22) Filed: Mar. 21, 2023

(65) Prior Publication Data

US 2023/0224365 A1    Jul. 13, 2023

Related U.S. Application Data

(63) Continuation of application No. 16/784,482, filed on Feb. 7, 2020, now Pat. No. 11,616,841.

(51) Int. Cl.
H04L 67/12         (2022.01)
G01K 1/02          (2021.01)
            (Continued)

(52) U.S. Cl.
CPC .............. H04L 67/12 (2013.01); G01R 31/14 (2013.01); G01R 31/2874 (2013.01);
            (Continued)

(58) Field of Classification Search
CPC ..... H04L 67/12; G01R 31/14; G01R 31/2874; G01R 31/2872; G01K 1/026;
            (Continued)

(56) References Cited

U.S. PATENT DOCUMENTS 7,086,058 B2    8/2006 Luick
10,132,695 B2    11/2018 Leighton, II
            (Continued)

FOREIGN PATENT DOCUMENTS

EP          3506548 A1    7/2019
KR      20180034528 A    4/2018
            (Continued)

OTHER PUBLICATIONS

German Patent and Trademark Office, Application No. 102020103244.7 , Office Action dated Oct. 23, 2020, 9 pages.
            (Continued)

*Primary Examiner* — Manuel L Barbee
(74) *Attorney, Agent, or Firm* — The Marbury Law Group, PLLC

(57)          ABSTRACT

A digital sensor network is overlaid on an integrated circuit for identifying and mapping hotspots in the integrated circuit. The digital sensor network may include a plurality of digital sensors distributed within an area of an integrated circuit component of an integrated circuit. Each of the plurality of digital sensors may include a ring oscillator and may be configured to output a counter value of a ring oscillator counted over a designated period. A sensor network control unit may be provided that is communicatively connected to the plurality of digital sensors via a communication circuit. The sensor network control unit may be configured to receive a plurality of counter values including the counter value from each of the plurality of digital sensors and identify a hotspot within the area of the integrated circuit.

20 Claims, 10 Drawing Sheets

(51) Int. Cl.

| | | |
|---|---|---|
| *G01K 3/14* | (2006.01) | |
| *G01R 31/14* | (2006.01) | |
| *G01R 31/28* | (2006.01) | |

(52) U.S. Cl.
CPC ....... *G01K 1/026* (2013.01); *G01K 2003/145* (2013.01); *G01K 2213/00* (2013.01)

(58) Field of Classification Search
CPC ......... G01K 2003/145; G01K 2213/00; G01K 7/01; G01K 7/425; G01K 7/427; G06F 11/3058; H04W 84/18; G01D 21/02
See application file for complete search history.

(56) References Cited

U.S. PATENT DOCUMENTS

| | | | |
|---|---|---|---|
| 10,747,258 B1 | 8/2020 | Freund et al. | |
| 2004/0037346 A1 | 2/2004 | Rusu et al. | |
| 2006/0161373 A1 | 7/2006 | Mangrulkar et al. | |
| 2008/0002757 A1* | 1/2008 | Kosta ..................... | G01K 7/425 |
| | | | 374/170 |
| 2008/0205110 A1 | 8/2008 | Boeve | |
| 2012/0096288 A1 | 4/2012 | Bates et al. | |
| 2013/0278241 A1 | 10/2013 | Chen et al. | |
| 2014/0354429 A1* | 12/2014 | Henderson ............ | G08B 21/22 |
| | | | 340/541 |
| 2015/0116545 A1* | 4/2015 | Ovsiannikov ......... | G06T 3/4053 |
| | | | 348/239 |

| | | | |
|---|---|---|---|
| 2017/0074729 A1 | 3/2017 | Coutts et al. | |
| 2017/0089769 A1 | 3/2017 | Krishnaswamy et al. | |
| 2017/0199089 A1* | 7/2017 | Fritchman ............ | G01K 15/005 |
| 2018/0073933 A1* | 3/2018 | Keskin .................... | G01K 1/14 |
| 2019/0317547 A1 | 10/2019 | Savoj et al. | |

FOREIGN PATENT DOCUMENTS

| | | |
|---|---|---|
| TW | 200533928 A | 10/2005 |
| TW | 201122498 A | 7/2011 |
| TW | 201333500 A | 8/2013 |
| TW | 201337277 A | 9/2013 |
| TW | 201842348 A | 12/2018 |
| TW | 201939048 A | 10/2019 |

OTHER PUBLICATIONS

Korean Patent and Trademark Office, Application No. 1020200055242 , Office Action dated Oct. 1, 2021, 5 pages.
Taiwan Patent and Trademark Office, Application No. 109134530 Office Action dated Jan. 3, 2022, 6 pages.
Korean Patent and Trademark Office, Application No. 1020200055242 , Notice of Allowance dated Dec. 30, 2021, 6 pages.
Korean Patent and Trademark Office, Application No. 10-2022-0040586 Office Action dated Jun. 29, 2022, 4 pages.

* cited by examiner

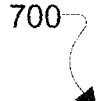
700
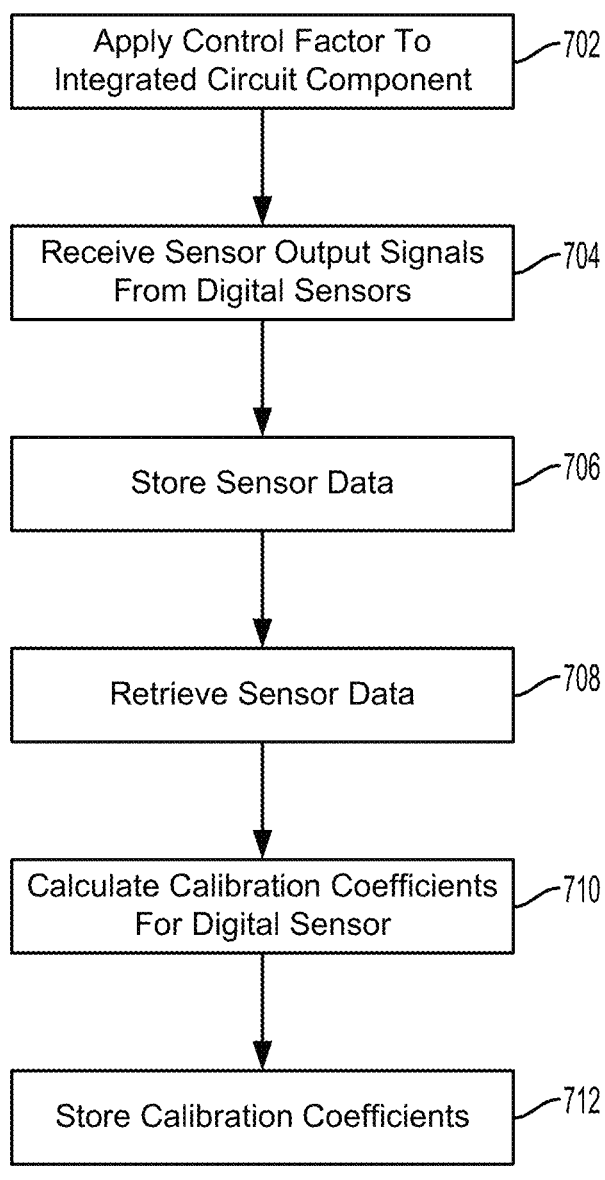
Apply Control Factor To
Integrated Circuit Component —702
Receive Sensor Output Signals
From Digital Sensors —704
Store Sensor Data —706
Retrieve Sensor Data —708
Calculate Calibration Coefficients
For Digital Sensor —710
Store Calibration Coefficients —712
FIG. 7

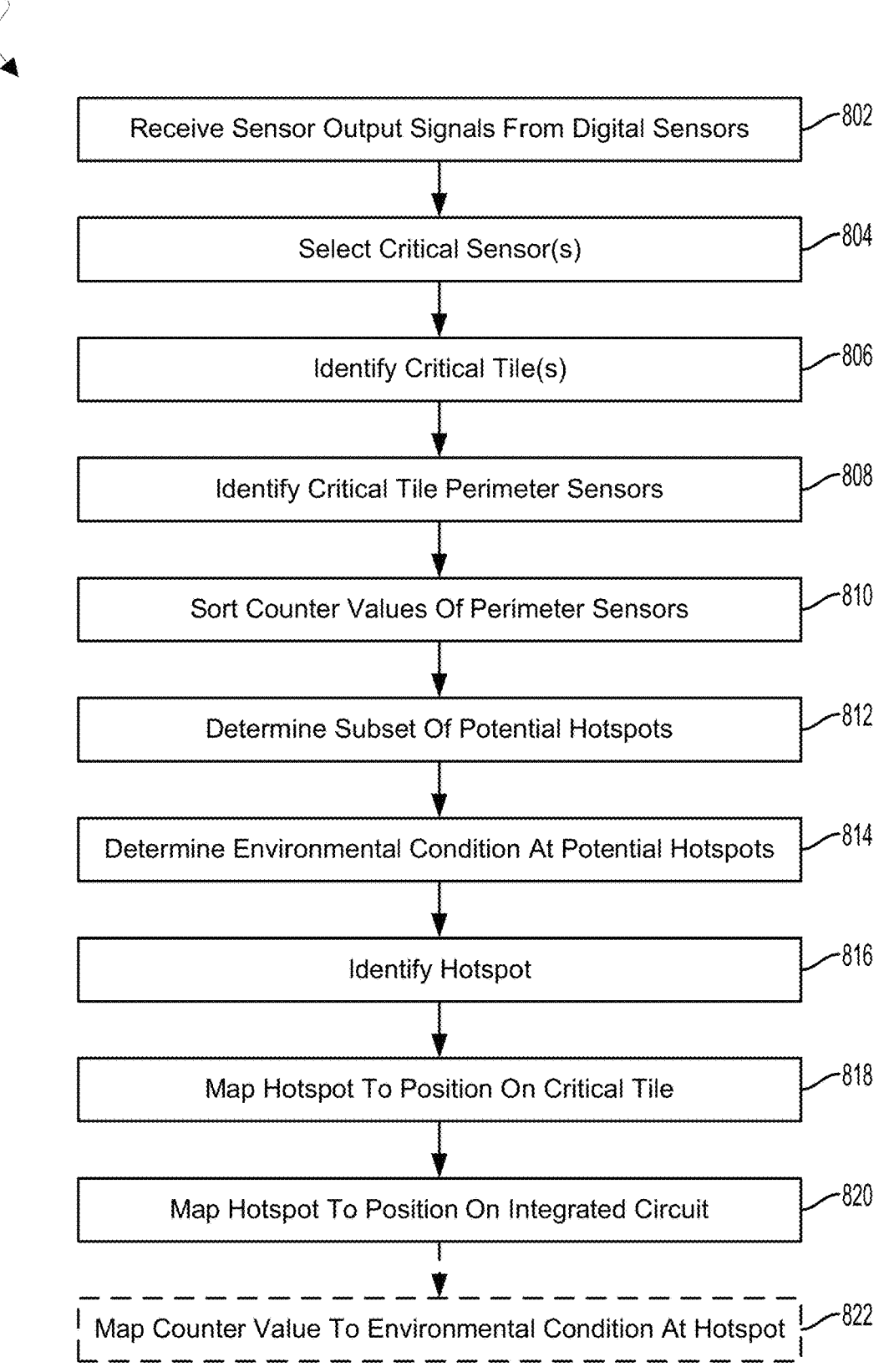

800

| | |
|---|---|
| Receive Sensor Output Signals From Digital Sensors | 802 |
| Select Critical Sensor(s) | 804 |
| Identify Critical Tile(s) | 806 |
| Identify Critical Tile Perimeter Sensors | 808 |
| Sort Counter Values Of Perimeter Sensors | 810 |
| Determine Subset Of Potential Hotspots | 812 |
| Determine Environmental Condition At Potential Hotspots | 814 |
| Identify Hotspot | 816 |
| Map Hotspot To Position On Critical Tile | 818 |
| Map Hotspot To Position On Integrated Circuit | 820 |
| Map Counter Value To Environmental Condition At Hotspot | 822 |

FIG. 8

REMOTE MAPPING OF CIRCUIT SPEED VARIATION DUE TO PROCESS, VOLTAGE AND TEMPERATURE USING A NETWORK OF DIGITAL SENSORS

RELATED APPLICATIONS

This application is a continuation U.S. Non-provisional patent application Ser. No. 16/784,482 entitled "Remote Mapping Of Circuit Speed Variation Due To Process, Voltage And Temperature Using A Network Of Digital Sensors" filed Feb. 7, 2020, the entire contents of which are incorporated herein by reference for all purposes.

BACKGROUND

The electronic circuits operating contemporary electronic devices have become incredibly powerful. The circuits often are capable of performing a large number of calculations per second enabling sophisticated functionality and applications. However, these circuits operate, the circuits demand more voltage and/or current to power their operations. As the current demands increases, the temperature of the circuit (due to the increased current across the resistance) increases. As the temperature of the circuit increases, the overall performance of the circuit may degrade. Therefore, the monitoring of the temperature of a circuit may be useful. When a temperature of a circuit is determined to rise above certain thresholds, steps may be taken to offload certain functions and/or calculations from particular circuits that may be approaching or over threshold temperatures so that the circuit may properly cool off.

Traditional process, voltage and temperature on-chip monitoring is done with very accurate analog circuits that are very large, require their own power supply and can be placed sparsely on the chip. Due to the size, power requirements, voltage or temperature sensors are often placed far from the critical circuits and cannot be used to directly measure the speed, voltage or temperature inside the critical areas.

BRIEF DESCRIPTION OF THE DRAWINGS

The accompanying drawings, which are incorporated herein and constitute part of this specification, illustrate example embodiments of various embodiments, and together with the general description given above and the detailed description given below, serve to explain the features of the claims. Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 is a process flow diagram illustrating a method for self-calibration of a sensor network control unit according to an embodiment.

FIG. 8 is a process flow diagram illustrating a method for identifying and mapping hotspots according to an embodiment.

DETAILED DESCRIPTION

Figure 1:
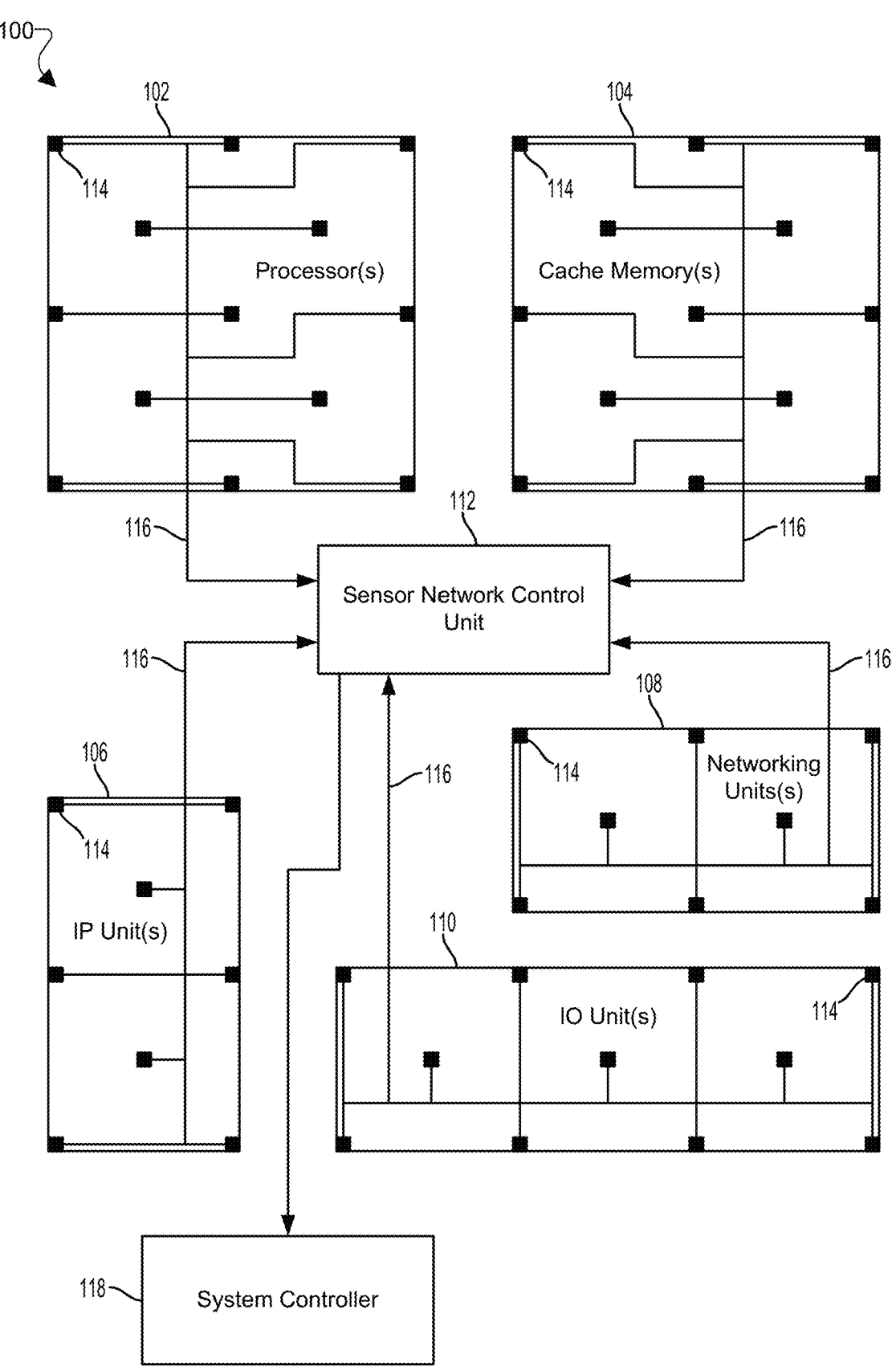
FIG. 1 is a component block diagram illustrating an example digital sensor network on an integrated circuit for implementing various embodiments.

The following disclosure provides many different embodiments, or examples, for implementing different features of the provided subject matter. Specific examples of components and arrangements are described below to simplify the present disclosure. These are, of course, merely examples and are not intended to be limiting. The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the claims.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "processor," "processor core," "controller," and "control unit" are used interchangeably herein, unless otherwise noted, to refer to any one or all of a software-configured processor, a hardware-configured processor, a general purpose processor, a dedicated purpose processor, a single-core processor, a homogeneous multi-core processor, a heterogeneous multi-core processor, a core of a multi-core processor, a microprocessor, a central processing unit (CPU), a graphics processing unit (GPU), a digital signal processor (DSP), etc., a controller, a microcontroller, a field programmable gate array (FPGA), an application-specific integrated circuit (ASIC), other programmable logic devices, discrete gate logic, transistor logic, and the like. A processor may be an integrated circuit, which may be configured such that the components of the integrated circuit reside on a single piece of semiconductor material, such as silicon.

Various embodiments may include devices, methods, and processing devices implementing such methods for remote mapping of circuit speed variation due to process, voltage, and/or temperature using a network of digital sensors. Some embodiments may include a network of digital sensors distributed in a symmetrical pattern on an integrated circuit. Each digital sensor may generate and output sensor signals representing process, voltage, and/or temperature measurements at a digital sensor. Some embodiments may include a sensor network control unit receiving the sensor signals, identifying a critical digital sensor of the digital sensor network and a critical tile to which the critical digital sensor belongs, determining and mapping a hotspot, a location of peak process, voltage, and/or temperature measurement, in the critical tile, and mapping the hotspot on the integrated circuit. Some embodiments may include a self-calibration process of the sensor network control unit to adjust for variations in the digital sensors.

Conventional means and methods for monitoring temperature or voltage/process speed include using large analog sensors that are too big to be placed within the actual circuits of components of an integrated circuit. Rather, the analog sensors are typically placed outside of the area of the components of the integrated circuit. The size and placement of the analog sensors may impact the speed at which the analog sensors can make their measurements. Moreover, the size and placement of the analog sensors may require a separate power supply for the analog sensors. While the analog sensors are capable of making accurate measurements of temperature at the sensors, the size of the analog sensor often restricts its placement to either location remote from the circuit itself or in areas that can only allow for overall measurements of temperature of the entire component as opposed to discrete areas within subsection of the integrated circuit. Thus, adjustments in response to the measured temperature are made on the same scale as the size of the critical area. Put another way, the operations of the entire components may be modified as opposed to more granular modification of subsection of the component. For similar reasons, analog sensor measurements for voltage/process speed are generally used for bring-up and initial speed testing of the component of the integrated circuit, and not used for management of the component during operation. Determinations of the adjustments to be made based on the analog sensor measurements are implemented in software, which increases the reaction time to the analog sensor measurements and is often too slow for modern integrated circuits. Conventional analog sensors are typically located far from critical areas and cannot pinpoint the source of heat or voltage drop. For that reason, conventional systems and sensors assume a worst case envelope to ensure that the integrated circuit is functional. Such conventional approaches are crude and pessimistic.

The disadvantages of analog sensors may be overcome through the use of a network of smaller, discrete, digital sensors distributed uniformly or quasi-uniformly on portions of or all of an integrated circuit. The digital sensors may be small enough to be to be placed within the area of a component of the integrated circuit, providing a finer granularity of measurements of process, temperature, and/or voltage than capable with the analog sensors on the integrated circuit. The finer granularity of the digital sensors may increase the accuracy of the location of the measurements of process, temperature, and/or voltage within components of the integrated circuit as compared to the measurements by an analog circuit. The digital sensors may be smaller than analog sensors, in part, because the digital sensors may not need a dedicated voltage supply. While the accuracy of the digital sensors may not be as accurate as an analog sensor, the digital sensor may be orders of magnitude faster in making measurements than the corresponding analog sensors.

A sensor network control unit may interpret the measurements of the digital sensors, detect a critical area of a component of the integrated circuit, construct a local map of a temperature and/or voltage gradient in the critical area, and identify a location of a peak temperature and/or voltage in the critical area and on the integrated circuit. In some embodiments, the sensor network control unit may be a hardware circuit configured to implement the functionality of the sensor network control unit. A hardware circuit based sensor network control unit may be able to use the finer granularity measurements of the digital sensors to not only locate a peak temperature and/or voltage more accurately on the integrated circuit, but also determine the measurements faster than a software for interpreting measurements of an analog circuit.

The sensor network control unit may further implement a self-calibration process that may adjust values used by the sensor network control unit operations to account for variations in the digital sensors. Such variations in the digital sensors may be the result of manufacturing variances or degradation of components over time. The self-calibration process may use a reference of a typical design performance characteristic of the digital sensors and measurements from the digital sensors under controlled conditions to calculate calibration coefficients for digital sensors that provide measurements that vary from the typical design performance characteristic. The calibration coefficients may be used in the calculations for constructing a local map of a temperature and/or voltage gradient in the critical area, and identifying a location of a peak temperature and/or voltage in the critical area and on the integrated circuit.

Determining the locations of peak temperature and/or voltage, with the finer level of granularity and faster speed afforded by the network of digital sensors and the sensor network control unit, may provide means for detecting a temperature or a voltage draw in any circuit of the integrated circuit that may affect the performance and/or longevity of the integrated circuit. The information determined by the network of digital sensors and the sensor network control unit may be used to accurately control circuits within components of the integrated circuit, rather than entire components of integrated circuits, to mitigate the effects of the peak temperature and/or voltage on the circuit without having to sacrifice the use of the remainder of the component.

FIG. 1 illustrates an example digital sensor network on an integrated circuit suitable for implementing various embodiments. An integrated circuit may include various components, such as any number and combination of processors 102, cache memories 104, Intellectual Property (IP) units 106 (which may include any special purpose logic block/unit/core circuit that may be integrated into the system), networking units 108, input/output (IO) units 110, and/or system controllers 118. In addition, the integrated circuit may include a digital sensor network 100 that may include any number and combination of digital sensors 114 placed throughout the integrated circuit and sensor network control units 112.

Figure 2:
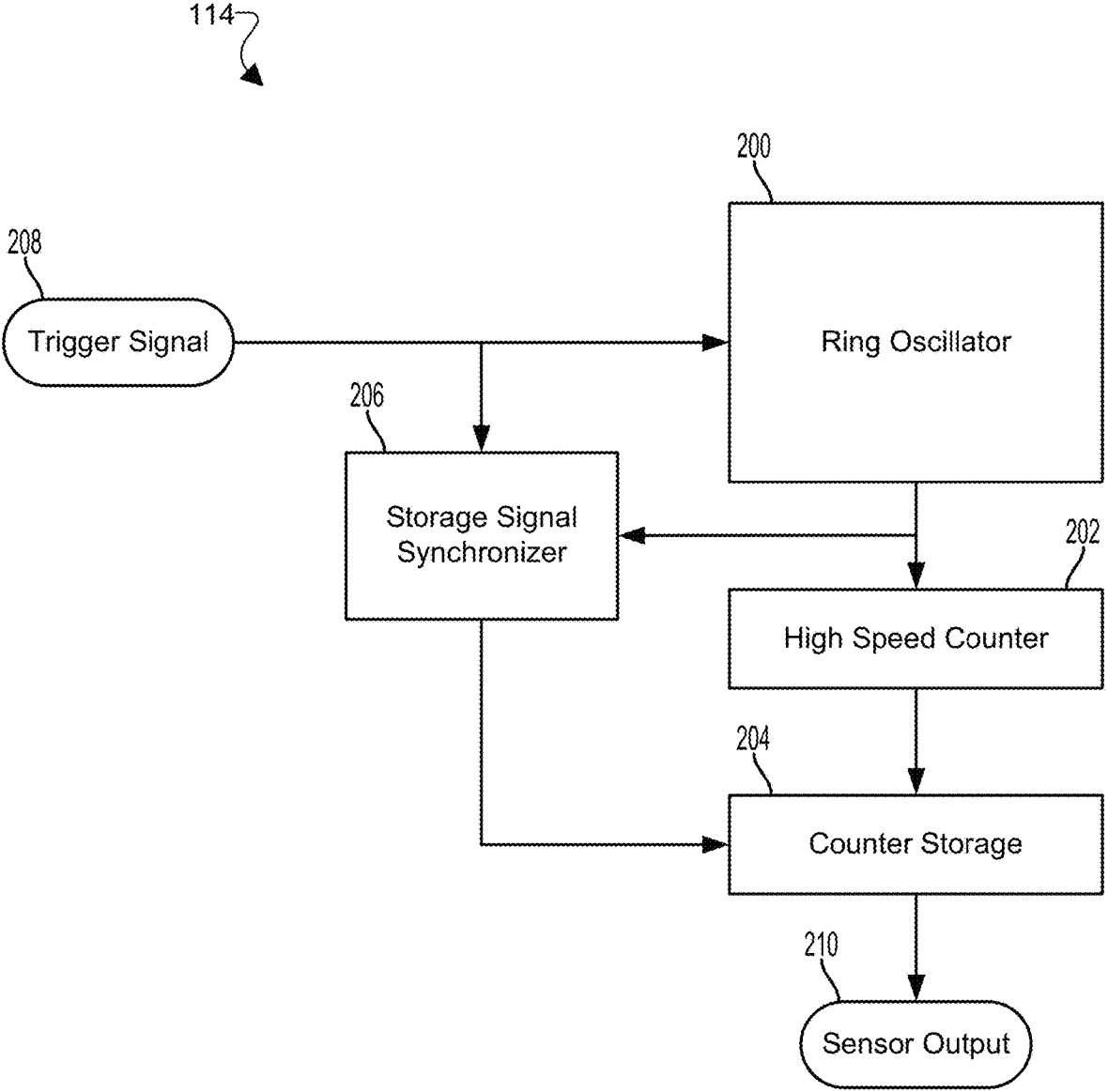
FIG. 2 is a component block diagram illustrating an example digital sensor suitable for implementing various embodiments.

The digital sensors 114, described further herein with reference to FIG. 2, may be placed on the integrated circuit substrate between circuits of the integrated circuit components 102, 104, 106, 108, 112. In some embodiments, the digital sensors 114 may be distributed uniformly within an area of an integrated circuit component 102, 104, 106, 108, 112. In some embodiments, locations of circuits of the integrated circuit component 102, 104, 106, 108, 112 may not allow a uniform distribution of the digital sensors 114 within the area of an integrated circuit component 102, 104, 106, 108, 112, and the digital sensors 114 may be distributed quasi-uniformly within the area of an integrated circuit component 102, 104, 106, 108, 112. A quasi-uniform distribution may be a distribution as close as possible to a uniform distribution given layout restrictions by circuits of the integrated circuit component 102, 104, 106, 108, 112 being located where a digital sensor 114 may be located in a uniform distribution. Both uniform and quasi-uniform distributions may be designed so as to not disrupt the circuit design of the integrated circuit component 102, 104, 106, 108, 112. Each digital sensor 114 may measure process speed, temperature, and/or voltage for circuits within a sensing range of the digital sensor 114 by reacting to conditions within the sensing range of the digital sensor 114.

Each digital sensor 114 may be communicatively connected to a sensor network control unit 112 by a communication circuit 116. In some embodiments, the communication circuit 116 may be an individual communication line between the digital sensor 114 and a dedicated input pin at the sensor network control unit 112 associated with the digital sensor 114 and a sensor identifier of the digital sensor 114. The sensor identifier may indicate to the sensor network control unit 112 from which digital sensors 114 the measurement is transmitted. The digital sensor 114 may transmit a measurement value to the dedicated input pin at the sensor network control unit 112 via the individual communication line. In some embodiments, the communication circuit 116 may be a communication bus between multiple digital sensors 114 and the sensor network control unit 112. The digital sensor 114 may transmit a measurement value and a sensor identifier to the sensor network control unit 112 via the communication bus. In some embodiments, the digital sensor 114 may write the measurement value and/or the sensor identifier directly to a memory (not shown), such as a register or cache, accessible by the sensor network control unit 112. In some embodiments, the digital sensor 114 may write the measurement value and/or the sensor identifier to a dedicated address for the digital sensor 114 in the sensor network control unit accessible memory. In some embodiments, the digital sensor 114 may write the measurement value and/or the sensor identifier to a first available address in the sensor network control unit accessible memory.

The sensor network control unit 112 may receive the measurement value and/or the sensor identifier from the digital sensor 114 via the communication circuit 116. In some embodiments, the sensor network control unit 112 may write the measurement value and/or the sensor identifier to the sensor network control unit accessible memory (not shown). In some embodiments, the sensor network control unit 112 may write the measurement value and/or the sensor identifier to an address in the sensor network control unit accessible memory associated with the dedicated input pin. In some embodiments, the sensor network control unit 112 may write the measurement value and/or the sensor identifier to an address in the sensor network control unit accessible memory associated with the sensor identifier. In some embodiments, the sensor network control unit 112 may write the measurement value and/or the sensor identifier to a first available address the sensor network control unit accessible memory.

Figure 5:
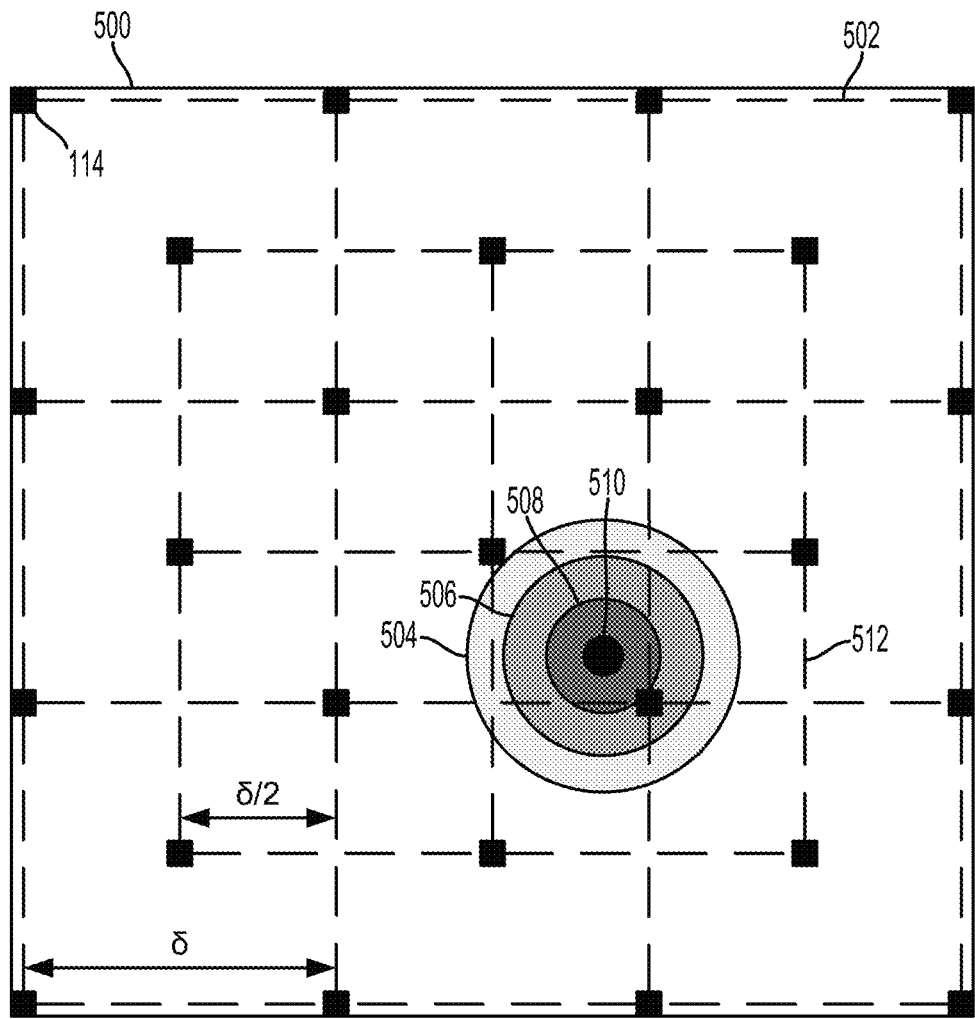
FIG. 5 is a component block diagram illustrating an example digital sensor network on an integrated circuit suitable for implementing various embodiments.

The sensor network control unit 112 may retrieve measurement values and sensor identifiers from the sensor network control unit accessible memory, and may use the retrieved measurement values and sensor identifiers to identify a critical group of digital sensors 114, referred to herein as a critical tile 512 and described further with reference to FIG. 5. The sensor network control unit 112 may retrieve and use other data, from any number and combination of sensor network control unit accessible memories, such as the measurement values, the sensor identifiers of the critical tile, tile identifiers, positions of tiles on the integrated circuit, calibration coefficients, and fitting matrix coefficients, all described further herein with reference to FIGS. 7-9. The sensor network control unit 112 may implement various arithmetic operations, such as multiply-add operations, using the other data to determine a hotspot, a location of peak process, voltage, and/or temperature measurement and described further with reference to FIGS. 6-9, in the critical tile, and map the hotspot to the on the integrated circuit. The hotspot may be mapped to a location within an area of the critical tile, which may be a subarea of an area of a component 102, 104, 106, 108, 112 of the integrated circuit. The sensor network control unit 112 may output the location of the hotspot and the process speed, temperature, and/or voltage of the hotspot to a system controller 118.

The system controller 118 may take adequate steps to adjust the process speed, temperature, and/or voltage of the hotspot. For example, the system controller 118 may reduce a frequency of a portion of the component 102, 104, 106, 108, 112 located at the hotspot, transfer processing work load from portion of the component 102, 104, 106, 108, 112 located at the hotspot to another portion (e.g., another processing core) of the component 102, 104, 106, 108, 112, etc.

The sensor network control unit 112 may also self-calibrate to account for manufacturing variances and degradation of the digital sensors 114. The sensor network control unit 112 may implement a self-calibration process that may compare measurements taken by the digital sensors 114 under controlled conditions, such as processing load and designated frequency, and received from the digital sensors 114 with a reference of a typical design performance characteristic of the digital sensors 114. The comparison may be calculations, described further herein with reference to FIGS. 8 and 9, configured to output calibration coefficients for the digital sensors 114. Calibration coefficients may be calculated for each digital sensor 114 and stored in a sensor network control unit memory in a manner associating the calibration coefficients with the digital sensor 114. The calibration coefficients may be used in calculations of the process speed, temperature, and/or voltage of a hotspot to adjust for manufacturing variances and degradation of the digital sensors 114. The hotspot calculated using the calibration coefficients may be used to identify a location of the hotspot, map the hotspot in the critical tile, and map the hotspot on the integrated circuit.

FIG. 2 illustrates an example digital sensor suitable for implementing various embodiments. A digital sensor 114 may include a ring oscillator 200, a high speed counter 202, a counter storage 204, and a store signal synchronizer 206. These components of the digital sensor 200, 202, 204, 206 may be sized to allow the digital sensor 114 to be placed in a uniform or quasi-uniform distribution within an area of a component of an integrated circuit (e.g., processor 102, cache memory 104, IP unit 106, networking unit 108, IO unit 110 in FIG. 1, integrated circuit component 500 in FIG. 5). While a typical analog temperature sensor may have an area of 200 $\mu m^2$, a digital sensor 114 may have a much smaller area. For example, a digital sensor 114 may use nanometer scale transistor technology, such as 5 nm fin field effect transistor (FinFET) technology, and may have an area of 10.6 $\mu m^2$. The digital sensor 114 may react to environmental conditions, such as heat or voltage, within a sensor range, measure an effect if the environmental condition on the digital sensor 114, and output the measurement as a measurement representing a process speed, a temperature, and/or a voltage. Herein, the terms "measurement," "measurement value," and "counter value" are used interchangeably to indicate output data of a digital sensor 114 representing the environmental condition effect on the digital sensor 114.

The ring oscillator 200 may include an input pin at which the ring oscillator 200 may receive a trigger signal 208. The trigger signal 208 may be a digital signal that may indicate to the digital sensor 114 when to measure and when not to measure the environmental condition in the sensor range of the digital sensor 114. For example, a rising edge of the trigger signal 208 may indicate to the digital sensor 114 to start measuring the environmental condition and a high value of the trigger signal 208 may indicate to the digital sensor 114 to continue measuring the environmental condition. Similarly, a falling edge of the trigger signal 208 may indicate to the digital sensor 114 to stop measuring the environmental condition and a low value of the trigger signal 208 may indicate to the digital sensor 114 to continue to not measure the environmental condition. In some embodiments, the indications of the rising edge and the high value of the trigger signal 208 and the falling edge and low value of the trigger signal 208 may be reversed. In some embodiments, the trigger signal 208 may be an analog signal for which a first voltage or current may indicate to the digital sensor 114 to start measuring the environmental condition and to continue measuring the environmental condition. Similarly, a second voltage or current of the trigger signal 208 may indicate to the digital sensor 114 to stop measuring the environmental condition and to continue to not measure the environmental condition. For clarity, the examples herein are described using the rising edge and high value of the trigger signal 208 to indicate to the digital sensor 114 to start and maintain measuring the environmental condition, and the falling edge and low value of the trigger signal 208 to indicate to the digital sensor 114 to stop and maintain not measuring the environmental condition. The trigger signal 208 may be controlled to elapse a designated period between signaling to the digital sensor 114 to start and stop measuring the environmental condition. The period may be designated programmatically and/or by a user.

For the digital sensor 114 to measure the environmental condition, the ring oscillator 200 may receive the rising edge and/or high value of the trigger signal 208. In response receiving the rising edge and/or high value of the trigger signal 208, the ring oscillator 200 may oscillate a ring oscillator signal and output the oscillating ring oscillator signal to a high speed counter 202 and to a storage signal synchronizer 206. The ring oscillator signal may be a digital signal that may oscillate between high and low values. In some embodiments, the ring oscillator 200 may use the trigger signal 208 to power the ring oscillator 200 and/or as an input for the ring oscillator signal. A speed at which the ring oscillator 200 may oscillate the ring oscillator signal may be affected by the environmental condition the digital sensor 114 measures. For example, the ring oscillator 200 being in a higher temperature environment may be affected in a manner that may cause the ring oscillator 200 to oscillate the ring oscillator signal slower relative to being in a lower temperature environment. In the foregoing example, the terms higher temperature and lower temperature may be relative to each other and/or to a temperature threshold. In high voltage applications, where performance may degrade in response to temperature increase, temperature accuracy may be important, and the digital sensor 114 may be configured to detect small changes in temperature. For example, the digital sensor 114 may be configured to detect a change in temperature by single digit degrees Celsius in a nanosecond measurement timescale, such as at least 2° C. in a measurement time of 10 ns. In low voltage applications, where performance may rapidly degrade in relation to voltage drop, voltage accuracy may be important, and the digital sensor 114 may be configured to detect small voltage drops. For example, the digital sensor 114 may be configured to detect a voltage drop of single digit millivolts in a nanosecond measurement timescale, such as at least 1 mV change at a low end of a voltage range in a measurement time of 10 ns. The ring oscillator 200 and the high speed counter 202 may be communicatively connected by a communication circuit. The ring oscillator 200 may output the ring oscillator signal to the high speed counter 202 via the communication circuit. The ring oscillator 200 and the storage signal synchronizer 206 may be communicatively connected by a communication circuit. The ring oscillator 200 may output the ring oscillator signal to the high speed counter 202 via the communication circuit. In some embodiments, the high speed counter 202 and the storage signal synchronizer 206 may be communicatively connected in parallel to the ring oscillator 200 via a shared communication circuit.

The high speed counter 202 may receive the ring oscillator signal from the ring oscillator 200 via the communication circuit. The ring oscillator signal may indicate to the high speed counter 202 when to increment a counter value of the ring oscillator signal. For example, a rising edge and/or a high value may indicate to the high speed counter 202 to increment the counter value, and a falling edge and/or a low value may indicate to the high speed counter 202 to stop incrementing the counter value. For clarity, the examples herein are described using the ring oscillator signal as in the foregoing example, however, in some embodiments, the indications of the ring oscillator signal to the high speed counter 202 may be reversed. In some embodiments, the high speed counter 202 may increment the counter value once in response to a rising edge and/or a high value of the ring oscillator signal. In some embodiments, the high speed counter 202 may repeatedly increment the counter value in response to a high value of the ring oscillator signal. In some embodiments, the high speed counter 202 may store the counter value to a counter storage 204, such as a register, accessible by the high speed counter 202 after each increment of the counter value. In some embodiments, the high speed counter 202 may store the counter value to the counter storage 204 in response to a falling edge and/or a low value of the ring oscillator signal. The high speed counter 202 may be communicatively connected to the counter storage 204 by a communication circuit. The high speed counter 202 may output the counter value signal to the counter storage 204 via the communication circuit. The counter storage 204 may receive the counter value from the high speed counter 202 via the communication circuit and store the counter value.

A storage signal synchronizer 206 may also receive the trigger signal 208 and interpret a falling end and/or low value of the trigger signal 208 to indicate to the digital sensor 114 to stop measurement. The storage signal synchronizer 206 may receive the ring oscillator signal from the ring oscillator 200 via the communication circuit. In response to receiving the falling edge and/or low value of the trigger signal 208 and the falling edge and/or low value of the ring oscillator signal, the storage signal synchronizer 206 may output a clear counter signal to the counter storage 204. In other words, the storage signal synchronizer 206 may align the trigger signal 208 with the ring oscillator signal to output the clear counter signal at an end of a measurement period for the digital sensor 114. The clear counter signal may be a digital signal that may alternate between high and low values, and may be the same type or an inverted type of digital signal value as the trigger signal 208 and/or the ring oscillator signal. In some embodiments, the clear counter signal may be generated from the trigger signal 208 and/or the ring oscillator signal. In some embodiments, the clear counter signal may be generated and/or selected in response to the trigger signal 208 and/or the ring oscillator signal. The storage signal synchronizer 206 and the counter storage 204 may be communicatively connected by a communication circuit. The storage signal synchronizer 206 may output the clear counter signal to the counter storage 204 via the communication circuit.

The counter storage 204 may receive the clear counter signal from the storage signal synchronizer 206 via the communication circuit. The clear counter signal may indicate to the counter storage 204 when to output a sensor output signal 210, which may include the stored counter value and/or a identifier for the digital sensor 114, to a sensor network control unit (e.g., sensor network control unit 112 in FIGS. 1 and 9) via a communication circuit (e.g., communication circuit 116 in FIG. 1). In some embodiments, the clear counter signal may further indicate to the counter storage 204 to clear the stored counter value. For example, a rising edge and/or a high value of the clear counter signal may indicate to the counter storage 204 to output a sensor output signal 210 and/or to clear the stored counter value. For clarity, the examples herein are described using the clear counter signal as in the foregoing example, however, in some embodiments, the counter storage 204 may rather respond similarly to a falling edge and/or a low value of the clear counter signal.

Figure 3:
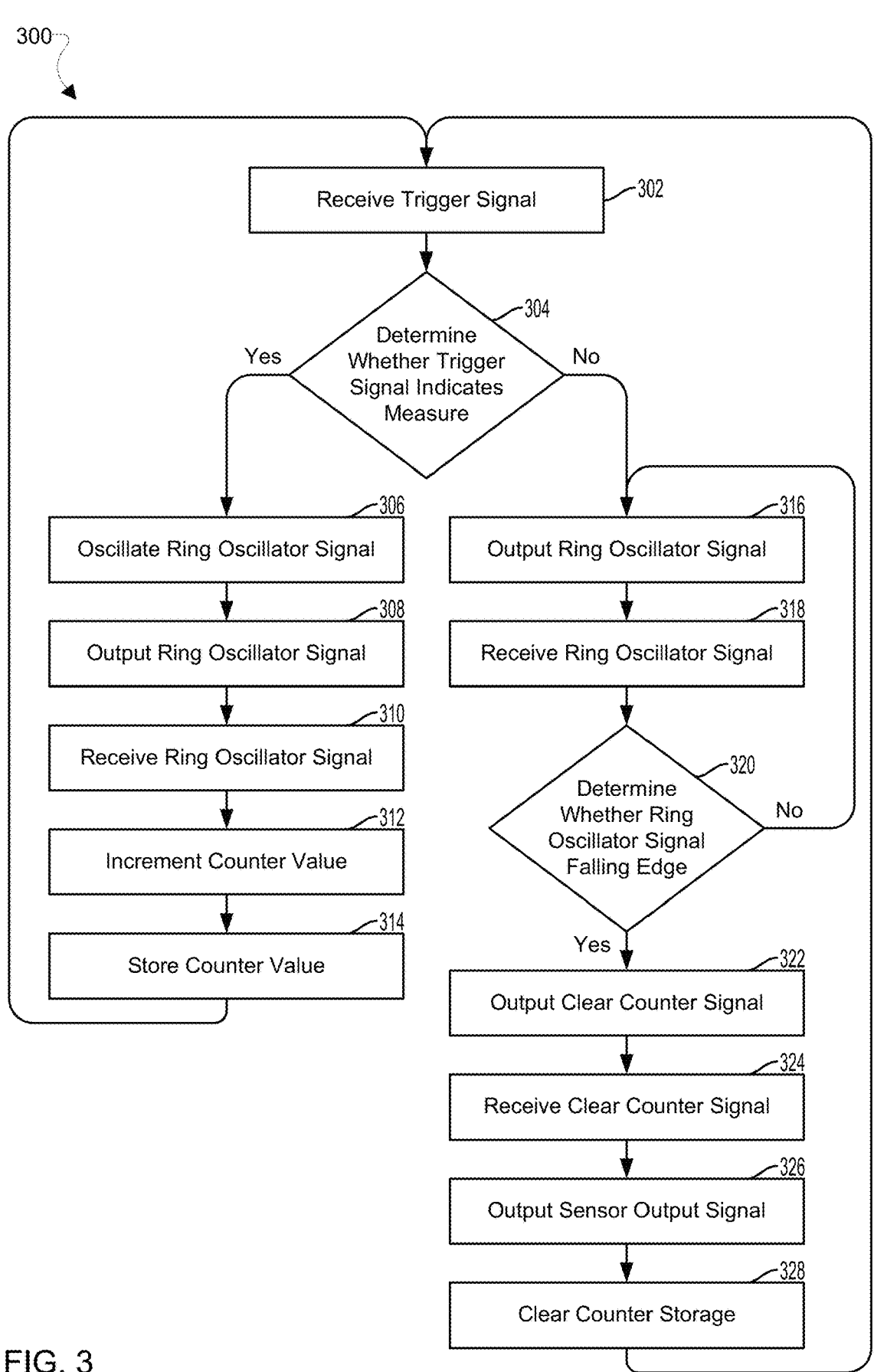
FIG. 3 is a process flow diagram illustrating a method for sensing an environmental condition at a digital sensor according to an embodiment.

FIG. 3 illustrates a method 300 for sensing an environmental condition at a digital sensor according to an embodiment. The method 300 may be implemented in dedicated hardware (e.g., digital sensor 114 in FIGS. 1, 2 and 5-6D, ring oscillator 200, high speed counter 202, counter storage 204, store signal synchronizer 206 in FIG. 2). In order to encompass the alternative configurations enabled in various embodiments, the hardware implementing the method 300 is referred to herein as a "sensing device." The method 300 is described herein with reference to certain structural elements for purposes of illustration and ease of reference. However, other suitable structural elements are contemplated within the scope of the disclosure for performing the operations described with reference to blocks 302-324 of the method 300.

In block 302, a sensing device may receive a trigger signal (e.g., trigger signal 208 in FIG. 2). The trigger signal may be a digital signal that may indicate to the sensing device when to measure and when not to measure the environmental condition in a sensor range of the sensing device. For example, a rising edge of the trigger signal may indicate to the sensing device to start measuring the environmental condition and a high value of the trigger signal may indicate to the sensing device to continue measuring the environmental condition. Similarly, a falling edge of the trigger signal may indicate to the sensing device to stop measuring the environmental condition and a low value of the trigger signal may indicate to the sensing device to continue to not measure the environmental condition. The falling edge and/or low value of the trigger signal may also partially indicate to the sensing device to output a sensor output signal (e.g., sensor output signal 210 in FIG. 2) and clear a storage device (e.g., counter storage 204 in FIG. 2) of the sensing device. In some embodiments, the indications of the rising edge and the high value of the trigger signal and the falling edge and low value of the trigger signal 208 may be reversed. In some embodiments, the trigger signal may be an analog signal for which a first voltage or current may indicate to the sensing device to start measuring the environmental condition and to continue measuring the environmental condition. Similarly, a second voltage or current of the trigger signal may indicate to the sensing device to stop measuring the environmental condition and to continue to not measure the environmental condition. The second voltage or current, or a third voltage or current, of the trigger signal may also partially indicate to the sensing device to output the sensor output signal and clear the storage device of the sensing device. For clarity, the examples herein are described using the rising edge and high value of the trigger signal to indicate to the sensing device to start and maintain measuring the environmental condition, and the falling edge and low value of the trigger signal to indicate to the sensing device to stop and maintain not measuring the environmental condition. These triggering methods are provided as examples, other methods to trigger the sensing device to start or stop measuring environmental conditions are within the contemplated scope of disclosure. The trigger signal may be controlled to elapse a designated period between signaling to the sensing device to start and stop measuring the environmental condition. The period may be designated programmatically and/or by a user. In some embodiments a ring oscillator 200 and/or a storage signal synchronizer 206 of a digital sensor 114 may receive a trigger signal in block 302.

In determination block 304, the sensing device may determine whether the trigger signal indicates to the sensing device to measure the environmental condition. In other words, the sensing device may determine whether the received trigger signal is a rising edge of the trigger signal or a high value of the trigger signal. The sensing device may determine whether the received trigger signal is a rising edge or a high value using various known means. In some embodiments, the ring oscillator 200 and/or the store signal synchronizer 206 may determine whether the trigger signal indicates to the sensing device to measure the environmental condition in determination block 304.

In response to determining that the trigger signal indicates to the sensing device to measure the environmental condition (i.e., determination block 304="Yes"), the sensing device may oscillate a ring oscillator signal in block 306. The ring oscillator signal may be a digital signal that may oscillate between high and low values. The ring oscillator signal may indicate to the sensing device when to increment a counter value of the ring oscillator signal. For example, a rising edge and/or a high value may indicate to the sensing device to increment the counter value, and a falling edge and/or a low value may indicate to the sensing device to stop incrementing the counter value. For clarity, the examples herein are described using the ring oscillator signal as in the foregoing example, however, in some embodiments, the indications of the ring oscillator signal to the sensing device may be reversed. In some embodiments, the sensing device may use the trigger signal to power the sensing device and/or as an input for the ring oscillator signal. In block 308, the sensing device may output the ring oscillator signal. In some embodiments, the ring oscillator 200 may oscillate a ring oscillator signal in block 306 and may output the ring oscillator signal in block 308.

In block 310, the sensing device may receive the ring oscillator signal. In some embodiments, a high speed counter 202 and/or the storage signal synchronizer 206 may receive the ring oscillator signal in block 310. In block 312, the sensing device may increment a counter value. In some embodiments, the sensing device may increment the counter value once in response to a rising edge and/or a high value of the ring oscillator signal. In some embodiments, the sensing device may repeatedly increment the counter value in response to a high value of the ring oscillator signal. In some embodiments, the high speed counter 202 may increment a counter value in block 312.

In block 314, the sensing device may store the counter value. The sensing device may store the counter value to a counter storage, such as a register, accessible by the sensing device after each increment of the counter value. In some embodiments, the sensing device may store the counter value to the counter storage in response to a falling edge and/or a low value of the ring oscillator signal. In some embodiments, the high speed counter 202 may store the counter value in block 314. Following storing the counter value in block 314, the sensing device may continue to receive the trigger signal in block 302.

In response to determining that the trigger signal does not indicate to the sensing device to measure the environmental condition (i.e., determination block 304="No"), the sensing device may output the ring oscillator signal in block 316, and the sensing device may receive the ring oscillator signal in block 318. In some embodiments, the ring oscillator 200 may output the ring oscillator signal in block 316 and the high speed counter 202 and/or the storage signal synchronizer 206 may receive the ring oscillator signal in block 318.

In determination block 320, the sensing device may determine whether the ring oscillator signal is a falling edge. The sensing device may determine whether the ring oscillator signal is a falling edge using various known means. In some embodiments, the storage signal synchronizer 206 may determine whether the ring oscillator signal is a falling edge in determination block 320. In response to determining that the ring oscillator signal is not a falling edge (i.e., determination block 320="No"), the sensing device may continue to output the ring oscillator signal in block 316.

In response to determining that the ring oscillator signal is a falling edge (i.e., determination block 320="Yes"), the sensing device may output a clear counter signal in block 322. In other words, the sensing device may align the trigger signal with the ring oscillator signal to output the clear counter signal at an end of a measurement period for the sensing device. The clear counter signal may be a digital signal that may alternate between high and low values, and may be the same type or an inverted type of digital signal value as the trigger signal and/or the ring oscillator signal. In some embodiments, the clear counter signal may be generated from the trigger signal and/or the ring oscillator signal. In some embodiments, the clear counter signal may be generated and/or selected in response to the trigger signal and/or the ring oscillator signal. The clear counter signal may indicate to the sensing device when to output the sensor output signal, which may include the stored counter value and/or an identifier for the sensing device, to a sensor network control unit (e.g., sensor network control unit 112 in FIGS. 1 and 9). In some embodiments, the clear counter signal may further indicate to the sensing device to clear the stored counter value. For example, a rising edge and/or a high value of the clear counter signal may indicate to the sensing device to output a sensor output signal and/or to clear the stored counter value. For clarity, the examples herein are described using the clear counter signal as in the foregoing example, however, in some embodiments, the sensing device may rather respond similarly to a falling edge and/or a low value of the clear counter signal. In some embodiments, the storage signal synchronizer 206 may output a clear counter signal in block 322.

In block 324, the sensing device may receive the clear counter signal. In block 326, the sensing device may output a sensor output signal. In block 328, the sensing device may clear the counter storage. In some embodiments, the counter storage 204 may receive the clear counter signal in block 324, output a sensor output signal in block 326, and clear the counter storage in block 328. Following clearing the counter storage in block 328, the sensing device may continue to receive the trigger signal in block 302.

Figure 4:
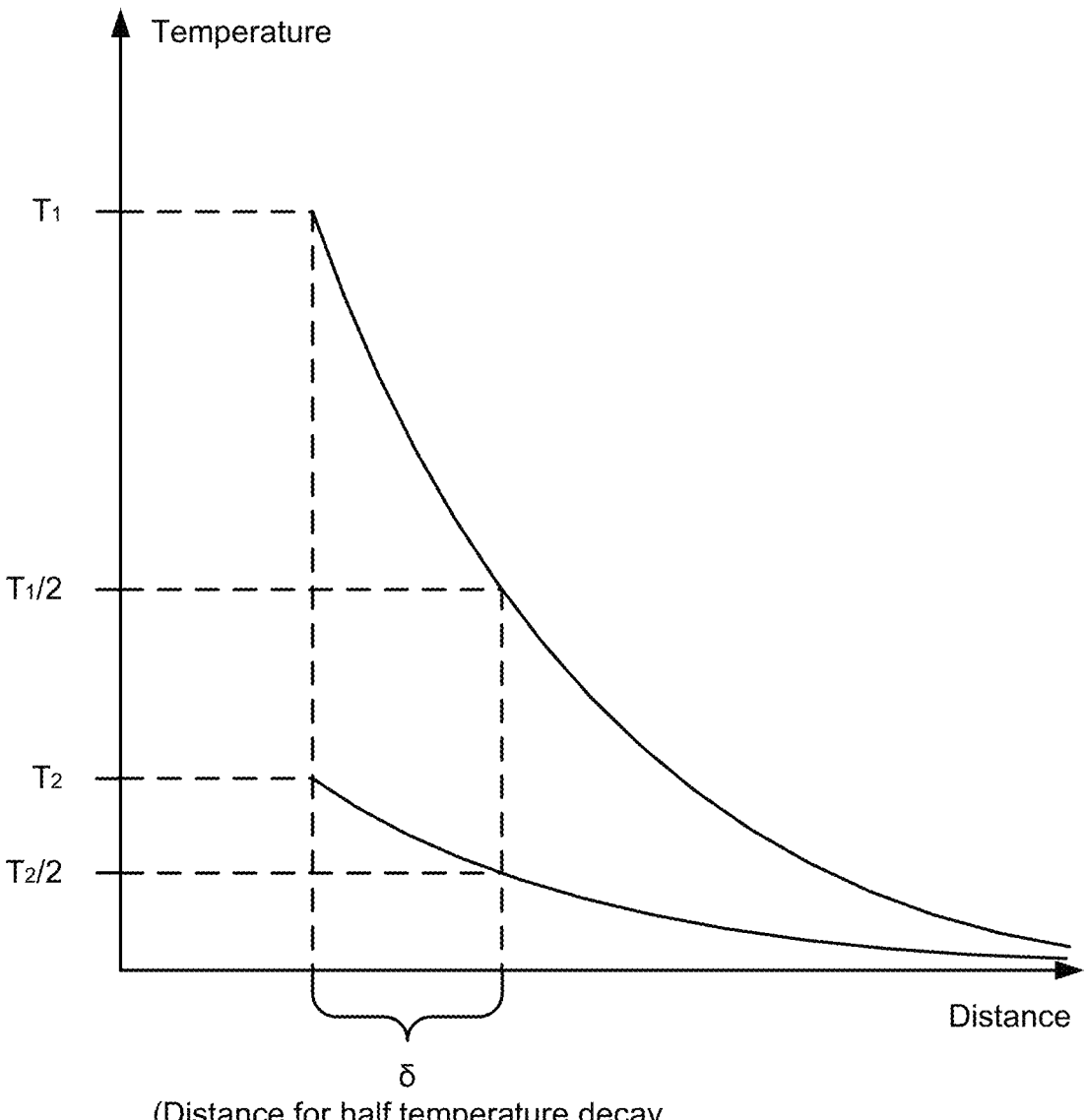
FIG. 4 is a graph diagram illustrating temperature decay on an integrated circuit.

FIG. 4 graphically illustrates temperature decay over distance on an integrated circuit. When an integrated circuit is operational, components of the integrated circuit (e.g., processor 102, cache memory 104, IP unit 106, networking unit 108, IO unit 110 in FIG. 1, integrated circuit component 500 in FIG. 5) may consume electrical power and generate heat. The heat may dissipate mainly through a substrate of the integrated circuit, such as silicon. The manner in which the temperature (T) decreases with distance away from a heat source (do), such as a hotspot, on the integrated circuit, as measured from a location (d) (e.g., a digital sensor 114 in FIG. 1) on the integrated circuit, may be calculated using an exponentially decaying function:

$$T(d) = T(d_0)e^{\left(-\frac{|d-d_0|}{\delta}\right)} \qquad \text{(eq. 1)}$$

where at a certain distance ($\delta$), the temperature may be half of what it is at the heat source, regardless of the temperature of the heat source. As illustrated in the graph of FIG. 4, a temperature ($T_1$ or $T_2$) at a first distance ($d_0$) may be halved ($T_1/2$ or $T_2/2$) at a second distance (d), when the first distance and the second distance are a certain distance ($\delta$) apart. A voltage discharge over distance may be calculated in the same manner by replacing temperature (T) for voltage (V):

$$V(d) = V(d_0)e^{\left(-\frac{|d-d_0|}{\delta}\right)} \qquad \text{(eq. 2)}$$

where voltage discharge may decay by half over a certain distance ($\delta$).

FIG. 5 illustrates an example of part of a digital sensor network within an area of an integrated circuit component suitable for implementing various embodiments. A digital sensor network (e.g., digital sensor network 100 in FIG. 1) may include portions that are configured to sense the environmental conditions for particular integrated circuit components 500 (e.g., processor 102, cache memory 104, IP unit 106, networking unit 108, IO unit 110 in FIG. 1). Placement of the digital sensors 114 may be uniformly or quasi-uniformly distributed over an area of an integrated circuit component 500. Any number of digital sensors 114 may be distributed over the area of the integrated circuit component 500. For clarity, the communication circuits (e.g., communication circuits 116 in FIG. 1), communicatively connecting the digital sensors 114 to a sensor network control unit (e.g., sensor network control unit 112 in FIGS. 1 and 9) are omitted from FIG. 5.

Groups of the digital sensors 114 may be referred to as tiles 502. A tile may include any number of digital sensors 114 configured in a symmetrical or quasi-symmetrical pattern. As with a quasi-uniform distribution of digital sensors 114, a quasi-symmetrical pattern of digital sensors 114 may be a distribution as close as possible to a symmetrical pattern given layout restrictions by circuits of the integrated circuit component 500 being located where a digital sensor 114 may be located in a symmetrical pattern. Both uniform and quasi-symmetrical patterns may be designed to not disrupt the circuit design of the integrated circuit component 500. For example, a uniform and/or quasi-symmetrical distribution pattern of digital sensors 114 may be a grid-like distribution pattern of digital sensors 114 in which rows and columns of digital sensors 114 may be offset by half the distance δ (e.g., δ/2). A resulting tile pattern may be a square having a digital sensor 114 at each corner of the perimeter of the square and a digital sensor 114 in the middle of the square. Each side of the square may be the distance δ, at which temperature and/or voltage discharge may decay by half. The digital sensors 114 on the perimeter of the square may be spaced apart by the distance δ. A distance between the perimeter of the square and the digital sensor 114 in the middle of the square may be half the distance δ (β/2). Adjacent tiles 502 and/or overlapping tiles 502 may share digital sensors 114. A tile 502 in which a center digital sensors 114 is calculated to be the closest digital sensor 114 to a hotspot 510 may be referred to as a critical tile 512. In an example tile 502, the environmental condition may decrease by half over a millimeter scale distance, such as approximately 1 mm, through substrate heat dissipation. A distribution of digital sensors 114 having a 0.5 mm tile side size may identify hotspots 510 with a precision of 31.5 mm. A common 64-bit integer multiplier may be approximately 40 mm×40 mm when formed in 5 nm transistor technology. A tile that is 0.5 mm×0.5 mm may contain 150 64-bit multipliers. A 31.5 mm precision means that precisely which specific multiplier is located at the hotspot may be identified. An area penalty due to the insertion of the sensors in such a tile distribution of the digital sensors 114 in the 64-bit integer multiplier may be 0.0125%.

A digital sensor 114 may more reliably measure a change in the environmental condition than another digital sensor 114 when the digital sensor 114 is closer to a hotspot than another digital sensor 114. Digital sensors 114 may be arranged in a grid-like pattern so that any hotspot 510 may occur in between digital sensors 114 of a critical tile 512 and so that the sensor ranges of the digital sensors 114 overlap. Such a configuration of digital sensors 114 may guarantee that functional digital sensors 114 register a change in the environmental condition. From measurements sensed by the digital sensors 114 surrounding a hotspot 510 and knowing how an environmental condition decays with distance on an integrated circuit, where the hotspot 510 is located and what peak environmental condition the hotspot 510 has may be calculated. For example, a hotspot 510, whose temperature predictably decays over radial distance 504, 506, 508, may occur between two digital sensors 114 of a critical tile 512, and may be sensed by any number of digital sensors 114 of the critical tile 512. A benefit of a grid-like distribution pattern of digital sensors 114 may be that for a given center digital sensor 114, the perimeter digital sensors 114 may be uniquely defined. It may be preferred to have a uniform pattern of distribution of digital sensors 114 so that the measurements from each digital sensor 114 may be interpreted the same way. However, some critical functional blocks of the integrated circuit component 500 may not allow precise placement of the digital sensors 114, resulting in a uniform pattern of distribution of digital sensors 114, having local "irregular" tiles 510. The concept and the mathematical processing of the measurement from such "irregular" tiles 510 may be the same as for regular tiles 510, only matrix coefficients may be different to adjust for the quasi-uniform distances. The sensor network control unit may have specific information for these irregular tiles 510.

The sensor network control unit may receive the measurements from the digital sensors 114 of the integrated circuit component 500 and determine which digital sensor 114 out of the digital sensor network 100 has the highest measurement among all. The sensor network control unit may identify the critical tile 512 by identifying which tile 502 has a center digital sensor 114 with a highest measurement. Identifying the critical tile 512 may identify the digital sensors 114 of the critical tile 512. The sensor network control unit may process the measurements of the digital sensors 114 of the critical tile 512, and produce the peak value of the environmental condition at the hotspot 510 and a location of the hotspot 510.

FIGS. 6A-6D illustrate examples of a critical tile 512 of a digital sensor network on an integrated circuit suitable for implementing various embodiments. A critical tile 512 may include any number of digital sensors 114 and a finite number of potential hotspots 600. The examples illustrated in FIGS. 6A-6D include the critical tile 512 having five digital sensors 114, where digital sensors A, B, C, and D are perimeter or corner digital sensors 114, and digital sensor E is a center digital sensor 114. In these examples, the number of potential hotspots 600 of the critical tile 512 may be a finite number $N^2$, where there may be N number of potential hotspots 600 per row and column of potential hotspots 600. As described herein, a critical tile 512 may be any symmetrical or quasi-symmetrical shape and include any number of digital sensors 114. The shape and size of the critical tile 512 and placement of the digital sensors 114 may affect the number and/or layout of the potential hotspots 600 of the critical tile 512. The examples illustrated in FIGS. 6A-6D are not limiting on the scope of the claims or the specification.

A series of equations may be used to determine features of a hotspot (e.g., hotspot 510 in FIG. 5) of the critical tile 512, including the environmental condition at the hotspot and the distance of the hotspot from the digital sensors 114 of the critical tile 512. The equations are described herein with reference to the examples illustrated in FIGS. 6A-6D, but may be modified to accommodate different configured critical tiles 512.

The measurements at a digital sensor 114 ($C_{sensor}$) of the critical tile 512 may be calculated as a function of the environmental condition ($C_{potential\ hotspot}$) at the potential hotspots 600 and distance ($d_{sensor,\ potential\ hotspot}$) between the digital sensor 114 and the potential hotspots:

$$C_{sensor} = \sum_{1}^{N} C_N \cdot e^{\left(\frac{d_{sensor,N}}{\delta}\right)} \qquad \text{(eq. 3)}$$

The exponential term may be rewritten to simplify the equation:

$$C_{sensor} = \sum_{1}^{N} C_N \cdot \varphi_{sensor,N} \qquad \text{(eq. 4)}$$

For each measurement of each of the digital sensors 114 ($C_{each\ sensor}$), a system of equations may be constructed:

$$C_{each\ sensor} = \begin{bmatrix} C_A \\ \vdots \\ C_E \end{bmatrix} = F \cdot \begin{bmatrix} C_1 \\ \vdots \\ C_N \end{bmatrix} \text{ where } F = \begin{bmatrix} \varphi_{A,1} & \cdots & \varphi_{A,N} \\ \vdots & \ddots & \vdots \\ \varphi_{E,1} & \cdots & \varphi_{E,N} \end{bmatrix} \quad \text{(eq. 5)}$$

The system of equations for the measurements of each of the digital sensors 114 (eq. 5) may be solved for the environmental condition at each of the potential hotspots 600 ($C_{each\ potential\ hotspot}$):

$$C_{each\ potential\ hotspot} = \begin{bmatrix} C_1 \\ \vdots \\ C_N \end{bmatrix} = F^{-1} \cdot \begin{bmatrix} C_A \\ \vdots \\ C_E \end{bmatrix} \quad \text{(eq. 6)}$$

However, the system of equations for the environmental condition at each of the potential hotspots 600 (eq. 6) may be under-determined and may not have a solution.

Figure 6A:
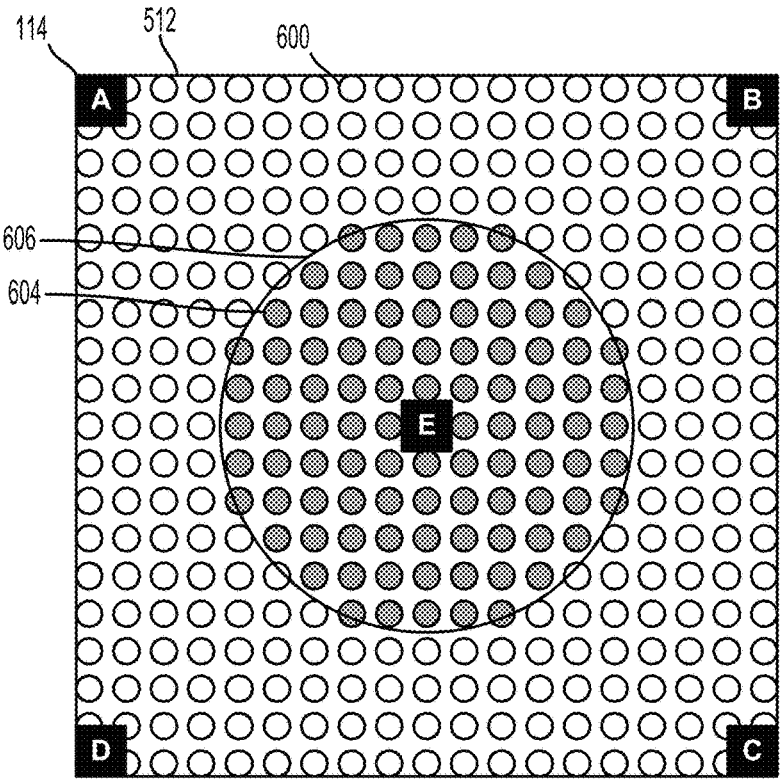
FIGS. 6A-6D are a component block diagrams illustrating examples of a critical tile of a digital sensor network on an integrated circuit suitable for implementing various embodiments.

FIGS. 6A-6D illustrate a configuration for narrowing the potential hotspots 600 to a number of the potential hotspots 600 for which the system of equations for the environmental condition at each of the potential hotspots 600 (eq. 6) may be solved. As described herein, a critical tile 512 is a tile (e.g., tile 502 in FIG. 5) of a portion of a digital sensor network (e.g., digital sensor network 100 in FIG. 1) for a particular integrated circuit component (e.g., processor 102, cache memory 104, IP unit 106, networking unit 108, IO unit 110 in FIG. 1, integrated circuit component 500 in FIG. 5) where a hotspot may be located closest to a center digital sensor 114 (digital sensor E) than the perimeter digital sensors 114 (digital sensors A, B, C, and D). Therefore, as illustrated in FIG. 6A, for a critical tile 512, the potential hotspots 600 may be narrowed to the potential hotspots 604 within a half tile width diameter 606 from the center digital sensor 114 (digital sensor E). Narrowing the potential hotspots 600 to the potential hotspots 604 within the half tile width diameter 606 may double the precision of the calculations for the environmental condition at a hotspot. This level of precision may allow the environmental condition at a hotspot to be discerned from other potential hotspots 604 separated by a distance on a micrometer scale. For example, this level of precision may allow for discernment of the environmental condition at a hotspot separated by a distance of 31.5 μm on a tile of 0.5 mm.

Figure 6B:
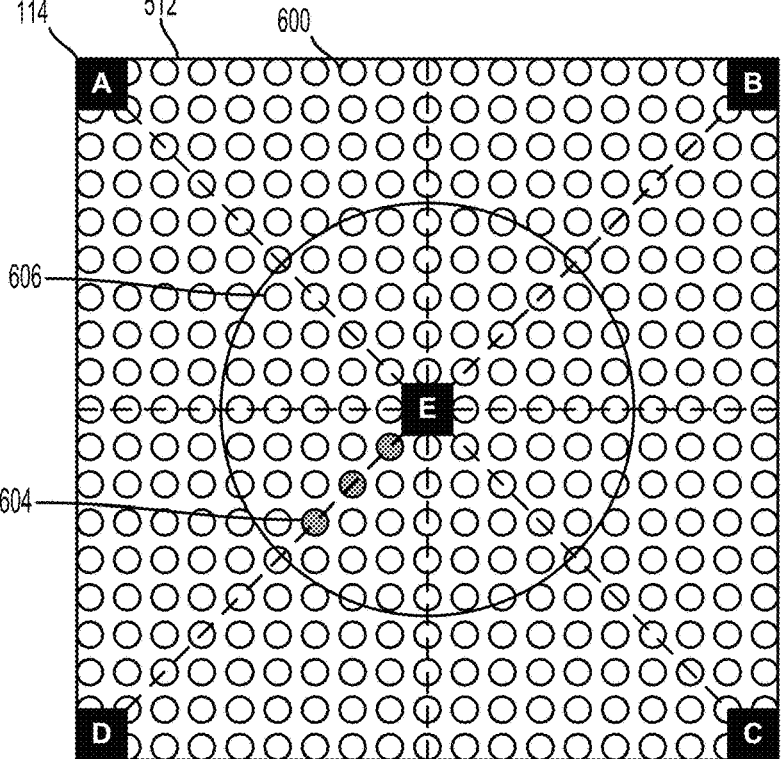
Figure 6C:
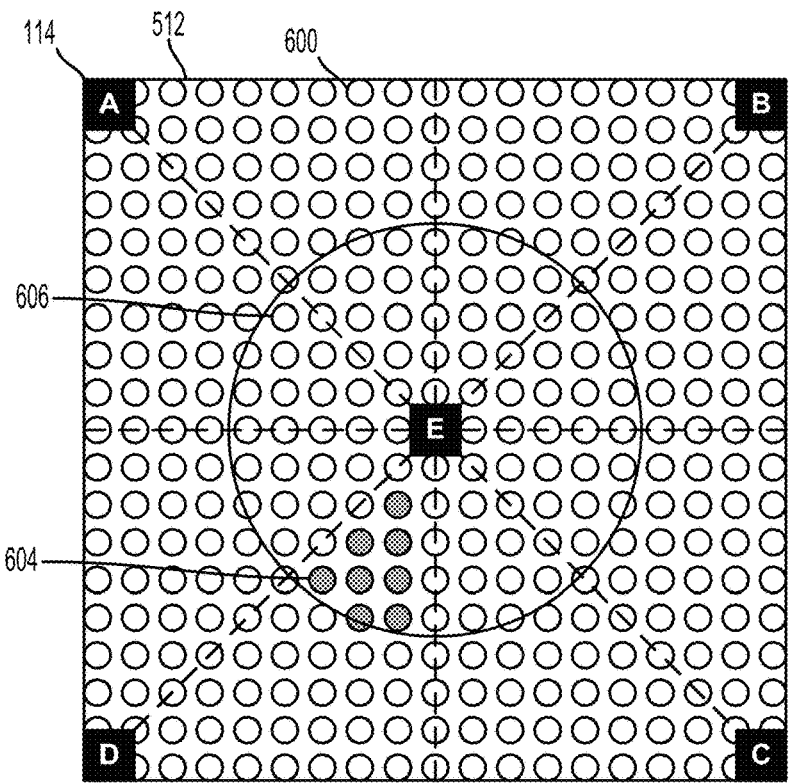
Figure 6D:
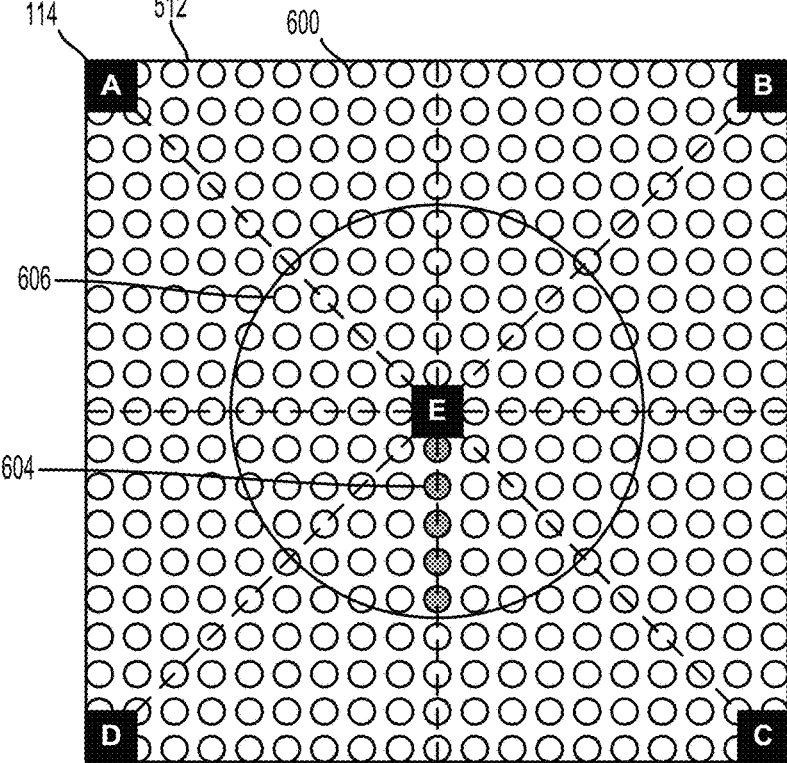

FIGS. 6B-6D illustrate further narrowing the potential hotspots 604 based on comparison of measurements between the digital sensors 114 to determine which of the perimeter digital sensors 114 (digital sensors A, B, C, and D) are next closest to the hotspot after the center digital sensor 114 (digital sensors E). Based on having five digital sensors 114, sorting the measurements of the digital sensors 114 may produce three different combinations per eighth of the half tile width diameter 606. For example, FIG. 6B illustrates a comparison of the measurements of the digital sensors 114 may indicate that the measurements of the digital sensors 114 may be ordered as E>D>C=A>B. With the potential hotspots 604 closest to center digital sensor E, then to the perimeter digital sensor D, and then equally to the perimeter digital sensor C and the perimeter digital sensor A, the potential hotspots 604 may be narrowed to potential hotspots 604 within the half tile width diameter 606 and along an axis between center digital sensor E and perimeter digital sensor D.

For another example, FIG. 6C illustrates a comparison of the measurements of the digital sensors 114 may indicate that the measurements of the digital sensors 114 may be ordered as E>D>C>B>A. With the potential hotspots 604 closest to the center digital sensor E, then to the perimeter digital sensor D, and then to the perimeter digital sensor C, the potential hotspots 604 may be narrowed to potential hotspots 604 within the half tile width diameter 606 and between an axis between the center digital sensor E and the perimeter digital sensor D and an axis bisecting the potential hotspots 604 between the perimeter digital sensor D and the perimeter digital sensor C.

For another example, FIG. 6D illustrates a comparison of the measurements of the digital sensors 114 may indicate that the measurements of the digital sensors 114 may be ordered as E>D=C>B=A. With the potential hotspots 604 closest to center digital sensor E and then equally to the perimeter digital sensor D and the perimeter digital sensor C, the potential hotspots 604 may be narrowed to potential hotspots 604 within the half tile width diameter 606 and along an axis bisecting the potential hotspots 604 between the perimeter digital sensor D and the perimeter digital sensor C.

The foregoing examples illustrated in FIGS. 6B-6D relate to the potential hotspots 604 in the eighth of the half tile width diameter 606 between the axis between the center digital sensor E and the perimeter digital sensor D and the axis bisecting the potential hotspots 604 between the perimeter digital sensor D and the perimeter digital sensor C. Similar comparisons of the digital sensors 114 resulting in different orders of the perimeter digital sensors 114 (A, B, C, and D), may similarly narrow the potential hotspots 604 in the other seven eighths of the half tile width diameter 606.

The system of equations for the environmental condition at each of the potential hotspots 600 (eq. 6) may be simplified to the equations for the potential hotspots 604. The digital sensors 114 may provide sufficient information to solve the less complex system of equations for the environmental condition at each of the potential hotspots 604 (eq. 6).

FIG. 7 illustrates a method 700 for self-calibration of a sensor network control unit according to an embodiment. The method 700 may be implemented in software executing in a processor (e.g., sensor network control unit 112 in FIGS. 1 and 9, system controller 116 in FIG. 1), in general purpose hardware, in dedicated hardware (e.g., sensor network control unit 112 in FIGS. 1 and 9), or in a combination of a software-configured processor and dedicated hardware, such as a processor executing software (e.g., sensor network control unit 112 in FIGS. 1 and 9, system controller 116 in FIG. 1) within a digital sensor network (e.g., digital sensor network 100 in FIG. 1) that includes other individual components (e.g., processor 102, cache memory 104, IP unit 106, networking unit 108, IO unit 110 in FIG. 1, integrated circuit component 500 in FIG. 5), and various memory/cache controllers. In order to encompass the alternative configurations enabled in various embodiments, the hardware implementing the method 700 is referred to herein as a "control device." The method 700 is described herein with reference to certain structural elements for purposes of illustration and ease of reference. However, other suitable structural elements are contemplated within the scope of the disclosure for performing the operations described with reference to blocks 702-712 of the method 700.

Digital sensors (e.g., digital sensor 114 in FIGS. 1, 2 and 5-6D) of a digital sensor network may be affected by manufacturing variances and/or degradation over time and may not perform as expected, such as not performing in accordance with an expected performance for a same type of digital sensor. A control device may implement a self-calibration of the control device to be able to adjust for variances in performance of the digital sensors. In some embodiments, the self-calibration of the control device may be executed for any number and combinations of digital sensors in response to anomalous sensor data from any number and combination of digital sensor, periodically, in response to a user prompt, etc.

In block 702, the control device may apply a control factor to an integrated circuit component. A control factor may be any combination of a workload, a voltage, a processor frequency, processor, memory, and/or communication operations, etc. for which, when the integrated circuit component, a normal environmental condition for the integrated circuit component is known. The control device may apply a control factor to any number and combination of integrated circuit components, such as integrated circuit components in an area of which digital sensors, that the control device is to be calibrated for, are distributed. In some embodiments, a sensor network control unit and/or a system controller may apply the control factor to the integrated circuit component in block 702. In some embodiments, the processor 102, the sensor network control unit 112, the system controller 116, or other processing device (not shown), such as a processor separate from the digital sensor network 100 and/or the integrated circuit having the digital sensor network 100, may apply the control factor to the integrated circuit component in block 702.

In block 704, the control device may receive sensor output signals from any number and combination of digital sensors of a digital sensor network. The control device may receive sensor output signals from at least the digital sensors distributed within the area of the integrated circuit component to which the control factor is applied in block 702. Each sensor output signal may include sensor data of a counter value and/or an identifier for the digital sensor that outputs the sensor output signal. In some embodiments, the sensor network control unit 112, including a sensor measurement input and storage unit (e.g., sensor measurement input and storage unit 904 in FIG. 9), may receive the sensor output signals from the digital sensors in block 704.

In block 706, the control device may store the sensor data of the sensor output signal. The control device may store the counter value and/or the identifier for the digital sensor that outputs the sensor output signal. The control device may store the sensor data to an integrated and/or accessible memory, which may be implemented as any number and combination of volatile and/or non-volatile memory devices, such as a register, a cache, a random access memory (RAM), a read only memory (ROM), an electrically erasable programmable ROM (EEPROM), a flash memory, etc. The control device may store the sensor data in a manner that associates the identifier for the digital sensor and the counter value from the digital sensor. In some embodiments, the identifier for the digital sensor stored to the memory may be received in the sensor output signal data or associated with a pin of the control device on which the sensor output signal is received, and written to the memory as part of storing the sensor output signal data or preloaded in the memory. In some embodiments, the sensor network control unit 112, including a sensor data memory (e.g., sensor data memory 930 in FIG. 9), may store the sensor data of the sensor output signal in block 706.

In block 708, the control device may retrieve the sensor data for a digital sensor. The control device may use the identifier of a digital sensor to retrieve sensor data for the digital sensor from the memory. The identifier of the digital sensor may be the identifier for a digital sensor selected by the control device to use in a self-calibration of the control device. In some embodiments, the sensor network control unit 112, including an arithmetic unit (e.g., arithmetic unit 916 in FIG. 9), may retrieve the sensor data for the digital sensor in block 708.

In block 710, the control device may calculate calibration coefficients for the digital sensor. For any distribution of digital sensors, the self-calibration process of the control device may use at least two sensor measurements for each digital sensor "i"

$$(CS_1^i \text{ and } CS_2^i)$$

to solve for the calibration coefficient values $$(d_0^i \text{ and } d_1^i)$$

using known reference counter values ($Cref_1$ and $Cref_2$):

$$d_0^i = \frac{CS_1^i \cdot Cref_2 - CS_2^i \cdot Cref_1}{Cref_2 - Cref_1} \qquad \text{(eq. 7)}$$

$$d_1^i = \frac{CS_1^i \cdot - CS_2^i}{Cref_1 - Cref_2} \qquad \text{(eq. 8)}$$

These calibration coefficient values $$(d_0^i \text{ and } d_1^i)$$

may be expressed as matrices for multiple digital sensors, such as an array of $$d_0^i$$

values may be notated as $D_0$ and a diagonal matrix of $$d_1^i$$

values may be notated as $D_1$. These calibration coefficients may be used to solve the system of equations for the environmental condition at each of the potential hotspots (eq. 6) while accounting for variances between the digital sensors. Knowing the reference sensor values for each of the digital sensors ($C_{sensor\ reference}$) the following equation can be solved for the environmental condition at each of the potential hotspots ($C_{each\ potential\ hotspot}$):

$$C_{sensor\ reference} = D_0 + D_1 \cdot C_{each\ sensor} = D_0 + D_1 \cdot F \cdot C_{each\ potential\ hotspot} \qquad \text{(eq. 9)}$$

Solving the above equation for the environmental condition at each of the potential hotspots ($C_{each\ potential\ hotspot}$), the system of equations for the environmental condition at each of the potential hotspots (eq. 6) becomes:

$$C_{each\ potential\ hotspot} = \left(F^T \cdot F\right)^{-1} \cdot F^T \cdot D_1^{-1} \cdot \left(C_{sensor\ reference} - D_0\right) \quad \text{(eq. 10)}$$

where $(F^T \cdot F)^{-1} \cdot F^T$ may be fixed and precomputed. In some embodiments, the sensor network control unit 112, including the arithmetic unit 916, may calculate the calibration coefficients for the digital sensor in block 710.

In block 712, the control device may store the calibration coefficients. The calibration coefficients may be stored in a manner that associates each of the calibration coefficients with an appropriate identifier of the digital sensor for which the calibration coefficients were calculated. In some embodiments, the calibration coefficients may be stored in the same memory or a different memory than the stored sensor data in block 706. In some embodiments, the sensor network control unit 112, including the arithmetic unit 916, may store the calibration coefficients in block 712.

FIG. 8 illustrates a method 800 for identifying and mapping hotspots according to an embodiment. The method 800 may be implemented in software executing in a processor (e.g., sensor network control unit 112 in FIGS. 1 and 9), in general purpose hardware, in dedicated hardware (e.g., sensor network control unit 112 in FIGS. 1 and 9), or in a combination of a software-configured processor and dedicated hardware, such as a processor executing software (e.g., sensor network control unit 112 in FIGS. 1 and 9) within a digital sensor network (e.g., digital sensor network 100 in FIG. 1) that includes other individual components (e.g., processor 102, cache memory 104, IP unit 106, networking unit 108, IO unit 110 in FIG. 1, integrated circuit component 500 in FIG. 5), and various memory/cache controllers. In order to encompass the alternative configurations enabled in various embodiments, the hardware implementing the method 800 is referred to herein as a "control device." In some embodiments, the method 800 may be implemented for any number and combination of integrated circuit components, including separately for multiple integrated circuit components and/or concurrently for multiple integrated circuit components. The method 800 is described herein with reference to certain structural elements for purposes of illustration and ease of reference. However, other suitable structural elements are contemplated within the scope of the disclosure for performing the operations described with reference to blocks 802-822 of the method 800.

In block 802, a control device may receive sensor output signals from any number and combination of digital sensors (e.g., digital sensor 114 in FIGS. 1, 2, and 5-6D) of a digital sensor network. The control device may receive sensor output signals from the digital sensors distributed within the areas of any number and combination of integrated circuit components. Each sensor output signal may include sensor data of a counter value and/or an identifier for the digital sensor that outputs the sensor output signal. In some embodiments, the sensor network control unit 112, including a sensor measurement input and storage unit (e.g., sensor measurement input and storage unit 904 in FIG. 9), may receive the sensor output signals from the digital sensors in block 802.

In block 804, the control device may select any number of critical digital sensors. In some embodiments, the control device may compare the counter values of the digital sensors with each other and determine which of the counter values is a critical counter value. A critical counter value may be a counter value at an extreme of a range of the compared counter values. In some embodiments, the control device may compare the counter values to expected counter values for the digital sensors that have identifiers of the digital sensors associated with the compared counter values, and may determine which of the counter values is a critical counter value. A critical counter value may be a counter value with a minimum or greatest deviation from an expected counter value. In some embodiments, the counter values may be adjusted by respective calibration coefficients prior to the comparisons. In some embodiments, the control device may select any number and combination of critical counter values, including based on a number of critical counter values to select and/or a critical counter value threshold, selecting based on critical counter values that exceed the critical counter value threshold. A critical counter value may be referred to as an extreme value of a comparison. The control device may identify an identifier of a digital sensor associated with a critical counter value as an identifier of a critical digital sensor. In some embodiments, the sensor network control unit 112, including a critical digital sensor data selection unit (e.g., critical digital sensor data selection unit 906 in FIG. 9), may select the critical digital sensors in block 804.

In block 806, the control device may identify any number of critical tiles (e.g., critical tile 512 in FIGS. 5-6D). The control device may use an identifier of a critical digital sensor to retrieve critical tile data from a memory. An identifier of a critical digital sensor may be for a center digital sensor of a tile (e.g., tile 502 in FIG. 5, critical tile 512 in FIGS. 5-6D). The identifier of the critical digital sensor may be associated with tile data, including an identifier of the tile. The control device may retrieve the identifier of the tile associated with the identifier of the critical digital sensor. The control device may identify the identifier of the tile associated with the identifier of the critical digital sensor as an identifier of a critical tile. In some embodiments, the sensor network control unit 112, including a tile data selection unit (e.g., tile data selection unit 912 in FIG. 9), may identify the critical tiles in block 806.

In block 808, the control device may identify perimeter digital sensors of the critical tiles. As above, the control device may use an identifier of a critical digital sensor to retrieve critical tile data from the memory. The identifier of the critical digital sensor may be associated with tile data, including an identifier of the tile and identifiers of perimeter digital sensors of the tile. In some embodiments, the control device may retrieve the identifiers of the perimeter digital sensors associated with the identifier of the critical digital sensor. The control device may identify the identifiers of the perimeter digital sensors associated with the identifier of the critical digital sensor as identifiers of the perimeter digital sensors of a critical tile. In some embodiments, the control device may retrieve the identifiers of the perimeter digital sensors associated with the identifier of a critical tile. The control device may identify the identifiers of the perimeter digital sensors associated with the identifier of the critical tile as identifiers of the perimeter digital sensors of the critical tile. In some embodiments, the sensor network control unit 112, including the tile data selection unit 912, may identify the perimeter digital sensors of the critical tiles in block 808.

In block 810, the control device may sort counter values of the perimeter digital sensors of the critical tiles. The control device may use the identifiers of the perimeter digital sensors of the critical tile to retrieve counter values associated with the identifiers of the perimeter digital sensors from a memory. The control device may sort the counter values of the perimeter digital sensors for each critical tile to narrow the locations of potential hotspots (e.g., potential hotspots

600, 604 in FIGS. 6A-6D) within each critical tile. In some embodiments, the control device may sort the counter values based on magnitude of the counter values in comparison to each other. In some embodiments, the control device may sort the counter values based on a magnitude of a deviation of the counter values from respective expected values. In some embodiments, the control device may use the identifiers of the perimeter digital sensors of the critical tile to retrieve calibration coefficients associated with the identifiers of the perimeter digital sensors from the memory. The retrieved counter values of the perimeter digital sensors may be adjusted by the respective calibration coefficients prior to the comparisons. The control device may sort the counter values into an order indicating to the control device which of the digital sensors of the critical tile is closer to a hotspot (e.g., hotspot 510, in FIG. 5) compared to the other digital sensors of the critical tile, with the center digital sensor being the closest, followed by the various perimeter digital sensors. In some embodiments, the sensor network control unit 112, including an arithmetic unit (e.g., arithmetic unit 916 in FIG. 9), may sort the counter values of the perimeter digital sensors of the critical tiles in block 810.

In block 812, the control device may determine a subset of potential hotspots (e.g., hotspots 604 in FIGS. 6A-6D). The control device may select potential hotspots for which to solve the system of equations for the environmental condition at each of the potential hotspots (eq. 10). As a center digital sensor is a critical digital sensor, it may be the closest digital sensor to a hotspot, and the control device may narrow the potential hotspots to the potential hotspots within a within a half tile width diameter from the center digital sensor (e.g., half tile width diameter 606 in FIGS. 6A-6D). The control device may determine that the potential hotspots may be further narrowed based on the relationships of the sorted counter values of the perimeter digital sensors. The control device may further narrow the potential hotspots to the potential hotspots between the center digital sensor and the perimeter digital sensors associated with a number of the top sorted counter values of the perimeter digital sensors. The control device may further narrow the potential hotspots based on the relationship between the number of the top sorted counter values of the perimeter digital sensors. For example, for two equal top sorted counter values, the control device may further narrow the potential hotspots to potential hotspots along an axis between the perimeter digital sensors associated with the two equal top sorted counter values. For another example, for a sequentially sorted counter values, the control device may further narrow the potential hotspots to potential hotspots between an axis connecting the center digital sensor and a perimeter digital sensor associated with a top sorted counter value, and an axis between the perimeter digital sensors associated with a next two top sorted counter values. For another example, for two equal top sorted counter values sequentially sorted below a top sorted counter value, the control device may further narrow the potential hotspots to potential hotspots along an axis connecting the center digital sensor and a perimeter digital sensor associated with the top sorted counter value. The control device may determine that the subset of potential hotspots may include the potential hotspots narrowed to by the control device. In some embodiments, the sensor network control unit 112, including the arithmetic unit 916, may determine a subset of potential hotspots in block 812.

In block 814, the control device may determine the environmental conditions at the potential hotspots of the subset of potential hotspots. To determine environmental conditions at the potential hotspots of the subset of potential hotspots, the control device may solve the system of equations for the environmental condition at each of the potential hotspots (eq. 10) using the counter values and the calibration coefficients of the digital sensors for the subset of potential hotspots to solve for the reference sensor values for each of the digital sensors (eq. 9). The control device may use resulting reference sensor values for each of the digital sensors and the calibration coefficients of the digital sensors for the subset of potential hotspots to solve the system of equations for the environmental condition at each of the potential hotspots (eq. 10). In some embodiments, the sensor network control unit 112, including the arithmetic unit 916, may determine the environmental conditions at the potential hotspots of the subset of potential hotspots in block 814.

In block 816, the control device may identify hotspots. Using the results of solving the system of equations for the environmental condition at each of the potential hotspots (eq. 10) for the subset potential hotspots, the control device may compare the results to determine which potential hotspot is a hotspot. The comparison may result in a hotspot having an environmental condition value that is more extreme, such as higher or lower, than all the other environmental condition values resulting from solving the system of equations for the environmental condition at each of the potential hotspots (eq. 10). The control device may identify the potential hotspot with the most extreme environmental condition value as a hotspot. In some embodiments, the sensor network control unit 112, including the arithmetic unit 916, may identify hotspots in block 816.

In block 818, the control device may map the hotspots to positions on the critical tiles. Predefined fitting matrix coefficients for each perimeter digital sensor of each tile may be stored in a memory in association with the identifier for the tile. The control device may retrieve the fitting matrix coefficient for the perimeter digital sensor associated with the top sorted counter value and associated with the critical tile from the memory. The control device, using the retrieved fitting matrix coefficients may map the hotspot to an offset from the perimeter digital sensor associated with the top sorted counter value and associated with the critical tile. In some embodiments, the sensor network control unit 112, including an integrated circuit position mapping unit (e.g., integrated circuit position mapping unit 922), may map the hotspots to a position on the critical tiles in block 818.

In block 820, the control device may map the hotspots to positions on an integrated circuit. In some embodiments, the control device may map a hotspot to a position on an integrated circuit. In some embodiments, the control device may map the hotspot to a position on an integrated circuit component. The examples herein are described using an integrated circuit; however, it should be clear that the mapping may similarly be made to an integrated circuit component. Each identifier of a tile may be associated with a coordinate position on an integrated circuit. Using the mapping of a hotspot to a critical tile and the position of the critical tile on the integrated circuit, the control device may determine a position of a hotspot on the integrated circuit. In some embodiments, the sensor network control unit 112, including the integrated circuit position mapping unit 922, may map the hotspots to positions on the integrated circuit in block 820.

In optional block 822, the control device may map counter values of the critical digital sensors to an environmental condition. The control device may map a counter value of a critical digital sensor to the environmental condition value resulting from solving the system of equations for the environmental condition at the hotspot (eq. 10). In some embodiments the sensor network control unit 112, including the integrated circuit position mapping unit 922, may map counter values of the critical digital sensors to an environmental condition in optional block 820.

Figure 9:
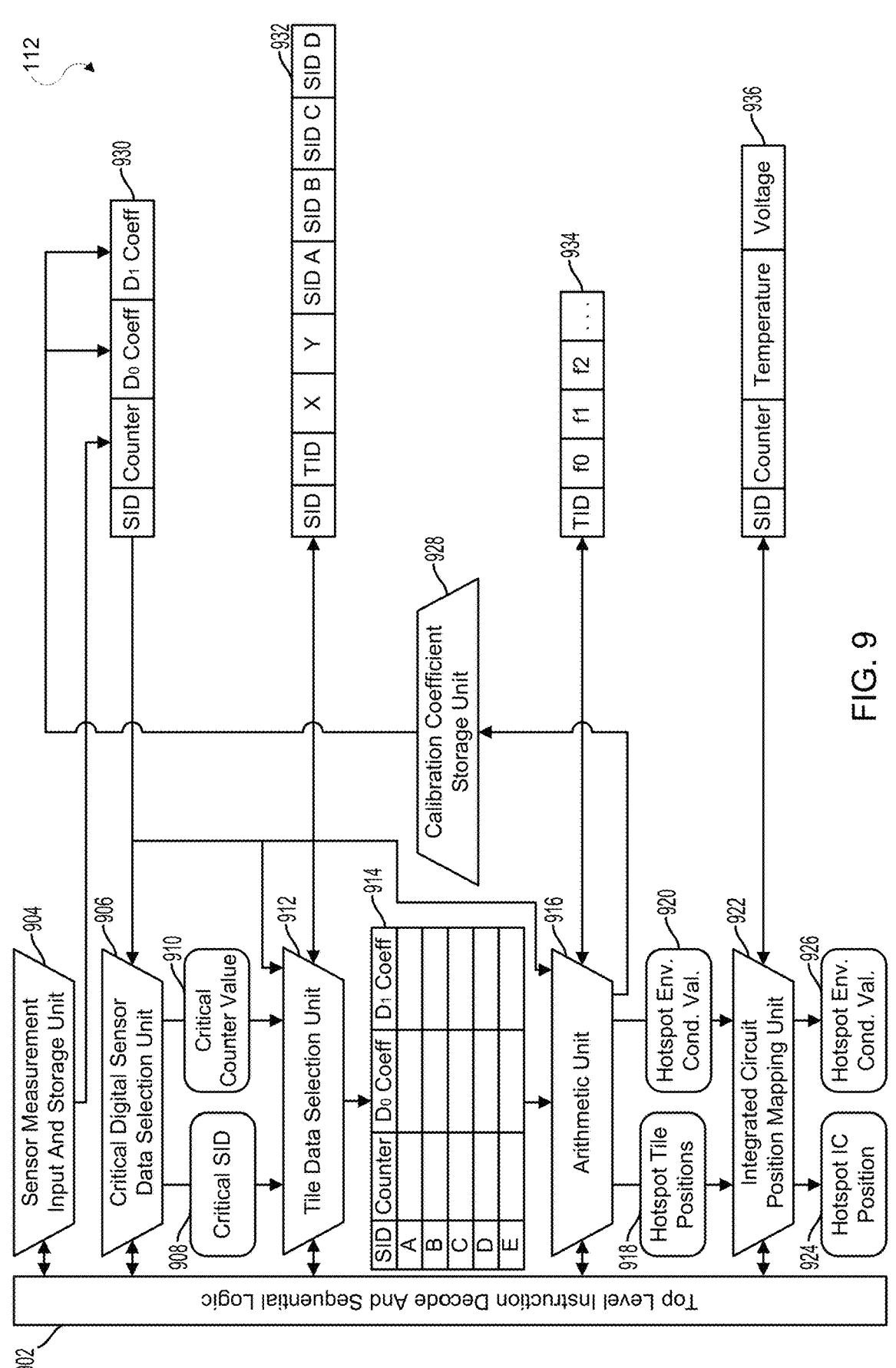
FIG. 9 is a component block and process flow diagram illustrating an example sensor network control unit suitable for implementing various embodiments.

FIG. 9 illustrates an example sensor network control unit and process flow suitable for implementing various embodiments. The sensor network control unit 112 may be configured to use counter values, measurements of an environmental condition from digital sensors (e.g., digital sensors 114 in FIGS. 1 and 6A-6D) of a digital sensor network (e.g., digital sensor network 100 in FIG. 1), to determine a location of a hotspot (e.g., hotspot 510 in FIG. 5) on an integrated circuit. In some embodiments, the various units 904, 906, 912, 916, 922 of the sensor network control unit 112 may be implemented in hardware. In some embodiments, the various units 904, 906, 912, 916, 922 of the sensor network control unit 112 may be implemented in a software configured processor. In some embodiments, the various units 904, 906, 912, 916, 922 of the sensor network control unit 112 may be implemented in a combination of hardware and a software configured processor. Various memories 914, 930, 932, 934, 936 may be implemented in any number and combination of volatile and/or non-volatile memory devices, such as a register, a cache, a RAM, a ROM, an EEPROM, a flash memory, etc. Data stored to the various memories 914, 930, 932, 934, 936 may be stored in any number and combination of data storage formats, including databases, data structures, raw data, etc., that may associate the data with a unique identifier, such as a sensor identifier (SID) or a tile identifier (TID).

A top level instruction decode and sequential logic 902 may facilitate execution of the functions of the sensor network control unit 112. The top level instruction decode and sequential logic 902 may decode and sequence instructions for the various units 904, 906, 912, 916, 922 of the sensor network control unit 112. Decoding and sequencing the instructions may involve retrieving opcode, operands, memory addresses, etc. need for implementing the instructions and controlling the order in which the instructions are implemented. The top level instruction decode and sequential logic 902 may be an interface between the various units 904, 906, 912, 916, 922 and instruction and data memories, such as the various memories 914, 930, 932, 934, 936.

A sensor measurement input and storage unit 904 may receive counter values from any number and combination of digital sensors of the digital sensor network. The counter values may be received in a sensor output signal (e.g., sensor output signal 210 in FIG. 2) from a counter storage (e.g., counter storage 204 in FIG. 2) of a digital sensor via a communication circuit (e.g., communication circuit 116 in FIG. 1). In some embodiments, the sensor measurement input and storage unit 904 may receive counter values from digital sensors of any number and combination of integrated circuit components (e.g., processor 102, cache memory 104, IP unit 106, networking unit 108, IO unit 110 in FIG. 1, integrated circuit component 500 in FIG. 5). In some embodiments, the sensor measurement input and storage unit 904 may receive the counter values on pins associated with designated digital sensors, such as associating a pin with an SID. In some embodiments, the sensor measurement input and storage unit 904 may receive the counter values on a bus interface along with data identifying a digital sensor, such as an SID, associated with a counter value.

The sensor measurement input and storage unit 904 may store the received counter values in a sensor data memory 930 (Counter). In some embodiments, the sensor measurement input and storage unit 904 may store the received counter values in association with an SID that may be preloaded in the sensor data memory 930. In some embodiments, the sensor measurement input and storage unit 904 may store the received counter values in association with an SID by creating an entry in the sensor data memory 930 for the SID and the associated, received counter values. In some embodiments, the sensor measurement input and storage unit 904 may store the received counter values and SIDs for digital sensors of any number and combination of integrated circuit components. The senor data memory 930 may further store calibration coefficients ($D_0$ Coeff, $D_1$ Coeff) associated with an SID for adjusting the counter values for manufacturing variance and/or degradation over time of the digital sensor associated with the SID.

A critical digital sensor data selection unit 906 may retrieve a portion or all of the stored SIDs and counter values from the sensor data memory 930. In some embodiments, the critical digital sensor data selection unit 906 may retrieve the stored SIDs and counter values from the sensor data memory 930 for digital sensors of any number and combination of integrated circuit components. In some embodiments, the critical digital sensor data selection unit 906 may compare the retrieved counter values with each other and determine which of the counter values is a critical counter value. A critical counter value may be a counter value at an extreme of a range of the compared counter values. In some embodiments, the critical digital sensor data selection unit 906 may compare the retrieved counter values to expected counter values for the digital sensors with the SIDs associated with the retrieved counter values, and may determine which of the counter values is a critical counter value. A critical counter value may be a counter value with a minimum or greatest deviation from an expected counter value. The retrieved counter values may be adjusted by the respective calibration coefficients prior to the comparisons. In some embodiments, the critical digital sensor data selection unit 906 may select any number and combination of critical counter values, including based on a number of critical counter values to select and/or a critical counter value threshold, selecting based on critical counter values that exceed the critical counter value threshold. A critical counter value may be referred to as an extreme value of a comparison. The critical digital sensor data selection unit 906 may identify an SID associated with a critical counter value as a critical SID. In some embodiments, the critical digital sensor data selection unit 906 may further retrieve the calibration coefficients associated with the retrieved SIDs. The critical digital sensor data selection unit 906 may output any number and combination of critical SIDs 908 and critical counter values 910 to a tile data selection unit 912.

The tile data selection unit 912 may receive the critical SIDs 908 and the critical counter values 910 from the critical digital sensor data selection unit 906. The tile data selection unit 912 may use a critical SID to retrieve critical tile data from a tile data memory 932. In the tile data memory 932, an SID of a center digital sensor of a tile, which may be the critical SID, may be associated with tile data, including a TID for the tile (e.g., tile 502 in FIG. 5, critical tile 512 in FIGS. 5-6D), tile offsets (X and Y) with respect to an integrated circuit and/or with respect to an integrated circuit component, and SIDs for the perimeter digital sensors of the tile. The tile data selection unit 912 may identify the critical SIDs as the center digital sensors of critical tiles (e.g., critical tile 512 in FIGS. 5-6D). The tile data selection unit 912 may retrieve the TID and the SIDs for the perimeter digital sensors associated with a critical SID from the tile data memory 932, and use the SIDs for the perimeter digital sensors to retrieve the counter values and the calibration coefficients associated with the SIDs for the perimeter digital sensors from the sensor data memory 930. The tile data selection unit 912 may also use the critical SID to retrieve the calibration coefficients associated with the critical SID from the sensor data memory 930. The tile data selection unit 912 may store, in association with each other, the critical SIDs, the critical counter values, and the calibration coefficients associated with the critical SIDs to a temporary critical tile data memory 914. The tile data selection unit 912 may store, in association with each other, the retrieved SIDs for the perimeter digital sensors of the critical SIDs, the counter values associated with the SIDs for the perimeter digital sensors, and the calibration coefficients associated with the SIDs for the perimeter digital sensors to the critical tile data memory 914. In some embodiments, the tile data selection unit 912 may also store the TIDs associated with the critical SIDs and the perimeter digital sensor SIDs to the critical tile data memory 914.

The arithmetic unit 916 may retrieve the counter values from the critical tile data memory 914, and sort the counter values to narrow the locations of potential hotspots within the critical tiles. In some embodiments, the arithmetic unit 916 may sort the counter values based on magnitude of the counter values in comparison to each other. In some embodiments, the arithmetic unit 916 may sort the counter values based on a magnitude of a deviation of the counter values from respective expected values. The expected counter values or the retrieved counter values may be adjusted by the respective calibration coefficients prior to the comparisons. The arithmetic unit 916 may sort the counter values into an order indicating to the arithmetic unit 916 which of the digital sensors of the critical tile is closer to the hotspot compared to the other digital sensors of the critical tile. The critical counter values may be the top sorted counter values and the counter values of the perimeter SIDs may be lower sorted counter values in relation to the critical counter value.

The arithmetic unit 916 may select a subset of potential hotspots for which to solve the system of equations for the environmental condition at each of the potential hotspots (eq. 10). As the center digital sensors are critical digital sensors, they may be the closest digital sensor to the hotspots, and the arithmetic unit 916 may narrow the potential hotspots to the potential hotspots within a within a half tile width diameter from each center digital sensor (e.g., half tile width diameter 606 in FIGS. 6A-6D). The arithmetic unit 916 may determine that the potential hotspots may be further narrowed based on the relationships of the sorted counter values of the perimeter digital sensors. The arithmetic unit 916 may further narrow the potential hotspots to the potential hotspots between the center digital sensors and the respective perimeter digital sensors associated with a number of the top sorted counter values of the perimeter digital sensors. The arithmetic unit 916 may further narrow the potential hotspots based on the relationship between the number of the top sorted counter values of the perimeter digital sensors. For example, for two equal top sorted counter values, the arithmetic unit 916 may further narrow the potential hotspots to potential hotspots along an axis between the perimeter digital sensors associated with the two equal top sorted counter values. For another example, for a sequentially sorted counter values, the arithmetic unit 916 may further narrow the potential hotspots to potential hotspots between an axis connecting a center digital sensor and a perimeter digital sensor associated with a top sorted counter value, and an axis between the perimeter digital sensors associated with a next two top sorted counter values. For another example, for two equal top sorted counter values sequentially sorted below another top sorted counter value, the arithmetic unit 916 may narrow the potential hotspots to potential hotspots along an axis connecting a center digital sensor and a perimeter digital sensor associated with the top sorted counter value. The arithmetic unit 916 may determine that the subset of potential hotspots may include the potential hotspots narrowed to by the arithmetic unit 916.

The arithmetic unit 916 may solve the system of equations to determine the environmental condition at each of the potential hotspots of the subset of potential hotspots. To determine environmental conditions at the potential hotspots of the subset of potential hotspots, the arithmetic unit 916 may solve the system of equations for the environmental condition at each of the potential hotspots (eq. 10) using the counter values and the calibration coefficients of the digital sensors for the subset of potential hotspots to solve for the reference sensor values for each of the digital sensors (eq. 9). The arithmetic unit 916 may use resulting reference sensor values for each of the digital sensors and the calibration coefficients of the digital sensors for the subset of potential hotspots to solve the system of equations for the environmental condition at each of the potential hotspots (eq. 10).

Using the results of solving the system of equations for the environmental condition at each of the potential hotspots (eq. 10) for the subset potential hotspots, the arithmetic unit 916 may compare the results to determine which potential hotspot is a hotspot. The comparison may result in a hotspot having an environmental condition value that is more extreme, such as higher or lower, than all the other environmental condition values resulting from solving the system of equations for the environmental condition at each of the potential hotspots (eq. 10) for the subset potential hotspots. The arithmetic unit 916 may identify the potential hotspots with the most extreme environmental condition values as hotspots.

The arithmetic unit 916 may map the hotspots to positions on the critical tiles. Predefined fitting matrix coefficients ($f0$, $f1$, $f2$, . . . ) for each perimeter digital sensor of each tile may be stored in a tile fitting memory 934 in association with the TIDs. The arithmetic unit 916 may retrieve the fitting matrix coefficients for the perimeter digital sensors associated with the top sorted counter values and associated with the critical tiles from the tile fitting memory 934. The arithmetic unit 916, using the retrieved fitting matrix coefficients may map the hotspots to offsets from the perimeter digital sensors associated with the top sorted counter values and associated with the critical tiles. The arithmetic unit 916 may output the hotspot tile positions 918 and the hotspot environmental condition values 920.

An integrated circuit position mapping unit 922 may receive the hotspot tile positions 918 and the hotspot environmental condition values 920 from the arithmetic unit 916. Using the hotspot tile positions, the integrated circuit position mapping unit 922 may map the hotspots to positions on an integrated circuit. In some embodiments, the control device may map the hotspots to positions on an integrated circuit. In some embodiments, the control device may map the hotspots to positions on an integrated circuit component. The examples herein are described using an integrated circuit; however, it should be clear that the mapping may similarly be made to an integrated circuit component. Each TID may be associated with a coordinate position on an integrated circuit. Using the mappings of the hotspots to the critical tiles and the positions of the critical tiles on the integrated circuit, the integrated circuit position mapping unit 922 may determine a position of each hotspot on the integrated circuit. The integrated circuit position mapping unit 922 may output the hotspot positions on the integrated circuit 924 and the hotspot environmental condition values 926.

Optionally, the integrated circuit position mapping unit 922 may map counter values of the critical digital sensors to an environmental condition. The integrated circuit position mapping unit 922 may map the critical counter values to the environmental condition values resulting from solving the system of equations for the environmental condition at the hotspots (eq. 10). The integrated circuit position mapping unit 922 may store the environmental condition values in association with the respective critical SIDs and critical counter values in an environmental condition mapping memory 936.

In some embodiments, the arithmetic unit 916 may use the counter values to execute self-calibration of the sensor network control unit. Using the counter values from the sensor data memory 930, the arithmetic unit 916 may calculate calibration coefficients for the digital sensors. The arithmetic unit 916 may solve the equations for the calibration coefficients (eq. 7 and eq. 8) using the counter values and reference values for the respective digital sensors. A calibration coefficient storage unit 928 may store the calculated calibration coefficients, in association with the respective SIDs associated with the counter values, to the sensor data memory 930.

Computer program code or "program code" for execution on a programmable processor for carrying out operations of the various embodiments may be written in a high level programming language such as C, C++, C #, Smalltalk, Java, JavaScript, Visual Basic, a Structured Query Language (e.g., Transact-SQL), Perl, or in various other programming languages. Program code or programs stored on a computer readable storage medium as used in this application may refer to machine language code (such as object code) whose format is understandable by a processor.

Referring to all drawings and according to various embodiments of the present disclosure, a digital sensor network is disclosed herein that may leverage smaller, faster discrete digital sensors to process efficiently the information from a network of the digital sensors to pinpoint the location and value of critical environment conditions (e.g., voltage and/or temperature). By using a multitude of digital sensors that are smaller albeit less accurate than analog sensors, the location of a hotspot may be determined with a finer degree of granularity and precision. The multitude of digital sensors may be located closer to critical areas of an integrated circuit and in a faster manner. Through the post-processing of the readings from the network of digital sensors, a control unit may produce an accurate value and position of the hotspot. In this manner, a system controller may take adequate steps to reduce the temperature (e.g., slow down the hotspot unit, transfer processing from a hot unit to another unit, etc.). Various embodiments are disclosed that may also provide self-calibration techniques to control manufacturing variation.

According to an embodiment of the present disclosure, a digital sensor network, is provided, which includes: a plurality of digital sensors 114 distributed within an area of an integrated circuit component (e.g., 102, 104, 106, 108, 110) of an integrated circuit, wherein each of the plurality of digital sensors 114 includes a ring oscillator 200 and is configured to output a counter value of a ring oscillator counted over a designated period; and a sensor network control unit 112 communicatively connected to the plurality of digital sensors 114 via a communication circuit 116, wherein the sensor network control unit 112 is configured to: receive a plurality of counter values including the counter value from each of the plurality of digital sensors 114; and identify a hotspot 510 within the area of the integrated circuit component (e.g., 102, 104, 106, 108, 110).

According to another embodiment of the present disclosure, a method for identifying and mapping hotspots 510 in a digital sensor network 100 having a plurality of digital sensors 114 within an area of an integrated circuit component (e.g., 102, 104, 106, 108, 110) of an integrated circuit, is provided that includes the steps of: receiving a plurality of counter values including a counter value from each of the plurality of digital sensors 114 within the area of the integrated circuit component; and identifying a hotspot 510 within the area of the integrated circuit component (e.g., 102, 104, 106, 108, 110).

The foregoing method descriptions and the process flow diagrams are provided merely as illustrative examples and are not intended to require or imply that the operations of the various embodiments must be performed in the order presented. As will be appreciated by one of skill in the art the order of operations in the foregoing embodiments may be performed in any order. Words such as "thereafter," "then," "next," etc. are not intended to limit the order of the operations; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm operations described in connection with the various embodiments may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the claims.

The hardware used to implement the various illustrative logics, logical blocks, modules, and circuits described in connection with the embodiments disclosed herein may be implemented or performed with a general purpose processor, a digital signal processor (DSP), an application-specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more embodiments, the functions described may be implemented in hardware, software, firmware, or any combination thereof. If implemented in software, the functions may be stored as one or more instructions or code on a non-transitory computer-readable medium or a non-transitory processor-readable medium. The operations of a method or algorithm disclosed herein may be embodied in a processor-executable software module that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the claims. Various modifications to these embodiments will be readily apparent to those skilled in the art, and the generic principles defined herein may be applied to other embodiments and implementations without departing from the scope of the claims. Thus, the present disclosure is not intended to be limited to the embodiments and implementations described herein, but is to be accorded the widest scope consistent with the following claims and the principles and novel features disclosed herein.

What is claimed is:

1. A digital sensor network, comprising:
a plurality of digital sensors distributed within an area of an integrated circuit component of an integrated circuit, the plurality of digital sensors including:
a first tile of digital sensors including a first plurality of perimeter digital sensors and a first center digital sensor located within the first plurality of perimeter digital sensors, wherein adjacent perimeter digital sensors of the first plurality of perimeter digital sensors are disposed approximately a first distance apart that is as close as possible to a distance at which an environmental condition measured using the plurality of digital sensors decays by approximately half given layout restrictions by circuits of the integrated circuit component, and a distance between the first center digital sensor and a side of the first tile is one-half the first distance.

2. The digital sensor network of claim 1, wherein the plurality of digital sensors further comprises:
a second tile of digital sensors including a second plurality of perimeter digital sensors and a second center digital sensor; and the first center digital sensor and the second center digital sensor are disposed approximately the first distance apart.

3. The digital sensor network of claim 1, wherein the first plurality of perimeter digital sensors includes a perimeter digital sensor and the plurality of digital sensors further comprises a second tile of digital sensors including a second plurality of perimeter digital sensors including the perimeter digital sensor and a second center digital sensor.

4. The digital sensor network of claim 1, wherein the plurality of digital sensors further comprises a second tile of digital sensors including a second plurality of perimeter digital sensors including the first center digital sensor and a second center digital sensor including a perimeter digital sensor of the first plurality of perimeter digital sensors.

5. The digital sensor network of claim 1, wherein:
the first plurality of perimeter digital sensors and the first center digital sensor are disposed such that a hotspot of the environmental condition within the tile is within a half tile width diameter of the first center digital sensor.

6. The digital sensor network of claim 1, wherein the environmental condition is temperature.

7. The digital sensor network of claim 1, further comprising:
a sensor network control unit communicatively coupled to the plurality of digital sensors, wherein the plurality of digital sensors generate a plurality of sensor output signals and the sensor network control unit is configured to determine a hotspot in the integrated circuit based on the plurality of sensor output signals.

8. The digital sensor network of claim 7, wherein the environmental condition includes at least one of process speed, temperature, or voltage in the integrated circuit component, and the plurality of sensor output signals are based on the measured condition.

9. The digital sensor network of claim 7, wherein a sensor output signal of the plurality of sensor output signals comprises a measurement value and a sensor identifier identifying a digital sensor of the plurality of digital sensors that generated the sensor output signal.

10. The digital sensor network of claim 7, wherein the plurality of digital sensors includes:
a ring oscillator configured to generate a ring oscillator signal in response to a trigger signal;
a counter configured to generate a counter value signal representing a counter value of the ring oscillator signal; and
a counter storage configured to:
store the counter value; and
generate a sensor output signal of the plurality of sensor output signals representing the stored counter value.

11. The digital sensor network of claim 10, wherein the plurality of digital sensors further comprises a storage signal synchronizer configured to generate a clear counter signal in response to the trigger signal and the ring oscillator signal, and the counter storage is further configured to generate the sensor output signal in response to the clear counter signal.

12. The digital sensor network of claim 7, wherein the integrated circuit comprises a plurality of integrated circuit components including the integrated circuit component, and the plurality of digital sensors are distributed in the plurality of integrated circuit components.

13. The digital sensor network of claim 12, wherein the plurality of integrated circuit components comprises at least one of a processor, a memory, an intellectual property (IP) unit, a networking unit or an input/output (I/O) unit, and the plurality of digital sensors are distributed in a grid-like pattern in the plurality of integrated circuit components.

14. The digital sensor network of claim 13, wherein the grid-like pattern comprises a plurality of tiles comprising the first tile, and the sensor network control unit identifies a tile of the plurality of tiles having a center digital sensor closest to the hotspot as a critical tile.

15. A digital sensor network, comprising:

a plurality of digital sensors distributed in a tile pattern within an integrated circuit component of an integrated circuit, wherein the plurality of digital sensors comprises:

a first tile including a plurality of first perimeter digital sensors and a first center digital sensor located at a center of the first tile, wherein adjacent perimeter digital sensors of the plurality of first perimeter digital sensors are separated by a first distance and a distance between the first center digital sensor and a side of the first tile is one-half the first distance; and a second tile including a plurality of second perimeter digital sensors and a second center digital sensor located at a center of the second tile, wherein adjacent perimeter digital sensors of the plurality of second perimeter digital sensors are separated by the first distance and a distance between the second center digital sensor and a side of the second tile is one-half the first distance, wherein a side length of the first tile and the second tile is substantially equal to a distance over which a condition to be measured by the plurality of digital sensors decays by half.

16. The digital sensor network of claim 15, wherein a digital sensor of the plurality of digital sensors comprises ring oscillator, a high speed counter coupled to the ring oscillator, and counter storage coupled to the high speed counter.

17. The digital sensor network of claim 15, wherein the first tile overlaps with the second tile such that:

at least one perimeter digital sensor of the first tile comprises a perimeter digital sensor of the second tile; or the first center digital sensor comprises a center digital sensor of the second tile.

18. A method of forming a digital sensor network, the method comprising:

forming a plurality of digital sensors distributed in a tile pattern within an integrated circuit component of an integrated circuit, wherein the forming of the plurality of digital sensors comprises:

forming a first tile including a plurality of first perimeter digital sensors and a first center digital sensor located at a center of the first tile, such that adjacent perimeter digital sensors of the plurality of first perimeter digital sensors are separated by a first distance and a distance between the first center digital sensor and a side of the first tile is one-half the first distance; and forming a second tile including a plurality of second perimeter digital sensors and a second center digital sensor located at a center of the second tile, such that adjacent perimeter digital sensors of the plurality of second perimeter digital sensors are separated by the first distance and a distance between the second center digital sensor and a side of the second tile is one-half the first distance, wherein the forming of the plurality of digital sensors is performed such that a side length of the first tile and the second tile is substantially equal to a distance over which a condition to be measured by the plurality of digital sensors decays by half.

19. The method of claim 18, wherein a digital sensor of the plurality of digital sensors comprises ring oscillator, a high speed counter coupled to the ring oscillator, and counter storage coupled to the high speed counter.

20. The method of claim 18, wherein the first tile overlaps with the second tile such that:

at least one perimeter digital sensor of the first tile comprises a perimeter digital sensor of the second tile; or the first center digital sensor comprises a center digital sensor of the second tile.

\*    \*    \*    \*    \*